United States Patent [19]
Yamamoto et al.

[11] Patent Number: 5,672,523
[45] Date of Patent: *Sep. 30, 1997

[54] THIN FILM TRANSISTOR SUBSTRATE, MANUFACTURING METHOD THEREOF, LIQUID CRYSTAL DISPLAY PANEL AND LIQUID CRYSTAL DISPLAY EQUIPMENT

[75] Inventors: Hideaki Yamamoto, Tukorozawa; Haruo Matsumaru, Tokyo; Yasuo Tanaka, Koganei; Ken Tsutsui, Tokyo; Toshihisa Tsukada, Musashino; Kazuo Shirahashi, Mobara; Akira Sasano, Tokyo; Yuka Matsukawa, Mobara, all of Japan

[73] Assignee: Hitachi, Ltd., Tokyo, Japan

[*] Notice: The term of this patent shall not extend beyond the expiration date of Pat. No. 5,585,290.

[21] Appl. No.: 451,209

[22] Filed: May 26, 1995

Related U.S. Application Data

[60] Continuation of Ser. No. 158,219, Nov. 29, 1993, Pat. No. 5,585,290, which is a division of Ser. No. 674,328, filed as PCT/JP90/01039 Aug. 13, 1990, Pat. No. 5,359,206.

[30] Foreign Application Priority Data

| Aug. 14, 1989 | [JP] | Japan | 1-207792 |
| Nov. 22, 1989 | [JP] | Japan | 1-302120 |
| Nov. 22, 1989 | [JP] | Japan | 1-302122 |

[51] Int. Cl.⁶ .................................................. H01L 21/84
[52] U.S. Cl. .................... 437/40; 437/194; 437/50; 437/51
[58] Field of Search ................ 437/41 TFT, 46 TFT, 437/50–51, 187, 194

[56] References Cited

U.S. PATENT DOCUMENTS

| 4,496,981 | 1/1985 | Ota | 358/213.13 |
| 4,543,573 | 9/1985 | Fuyama et al. | 359/87 |
| 4,775,549 | 10/1988 | Ota et al. | 340/784 |
| 4,821,092 | 4/1989 | Noguchi. | |
| 4,885,232 | 12/1989 | Spak | 430/326 |
| 4,905,066 | 2/1990 | Dohjo et al. | |

(List continued on next page.)

FOREIGN PATENT DOCUMENTS

| 57-22383 | 2/1982 | Japan. |
| 57-81288 | 5/1982 | Japan. |
| 58-88784 | 5/1983 | Japan. |
| 58-125087 | 7/1983 | Japan. |
| 61-133662 | 6/1986 | Japan. |
| 62-35669 | 2/1987 | Japan. |
| 62-43012 | 2/1987 | Japan. |
| 62-150858 | 7/1987 | Japan. |
| 1-152425 | 6/1989 | Japan. |

*Primary Examiner*—John Niebling
*Assistant Examiner*—Richard A. Booth
*Attorney, Agent, or Firm*—Antonelli, Terry, Stout & Kraus, LLP

[57] ABSTRACT

The present invention concerns an active-matrix addressed TFT substrate using a thin film transistor, a manufacturing method and an anodic oxidation method thereof, a liquid crystal display panel using the TFT substrate and a liquid crystal display equipment using the liquid crystal display panel. Cr or Ta is used for gate terminals; aluminum or a metal composed mainly of aluminum is used for gate bus-lines extended therefrom, gate electrodes and thin film capacitances (additional capacitance, storage capacitance); and an anodic oxidized film composed of the metal and free from defect is used for at least one of gate insulators, dielectric films of the thin film capacitances and interlayer insulation films for the intersections between the bus-lines. In forming a selective oxidation mask to a desired region on the aluminum pattern with a positive type photoresist, for the anodic oxidation, an angle ($\theta$) formed between the selective oxidation mask and the aluminum pattern is made as: $\beta \geq 110 - 20T$ (T: film thickness of the positive type photoresist). The photoresist is subjected to a heat treatment prior to and after exposure, preferably the after-treatment being performed before developing. The anodic oxidation film is heat-treated after formation, to reduce the leak current.

1 Claim, 29 Drawing Sheets

U.S. PATENT DOCUMENTS

| | | |
|---|---|---|
| 4,918,504 | 4/1990 | Kato et al. . |
| 4,990,460 | 2/1991 | Moriyama . |
| 5,021,320 | 6/1991 | Mueller et al. ............... 430/192 |
| 5,028,551 | 7/1991 | Dohio et al. . |
| 5,034,340 | 7/1991 | Tanaka et al. ............... 437/41 |
| 5,054,887 | 10/1991 | Kato et al. ............... 359/59 |
| 5,070,379 | 12/1991 | Nomoto et al. . |
| 5,142,390 | 8/1992 | Ohta et al. ............... 359/58 |
| 5,146,301 | 9/1992 | Yamamura et al. . |
| 5,155,564 | 10/1992 | Hishida et al. . |

TERMINAL PORTION    WIRE CROSSING    TFT    PICTURE ELEMENT PORTION    ADDITIONAL CAPACITANCE PORTION

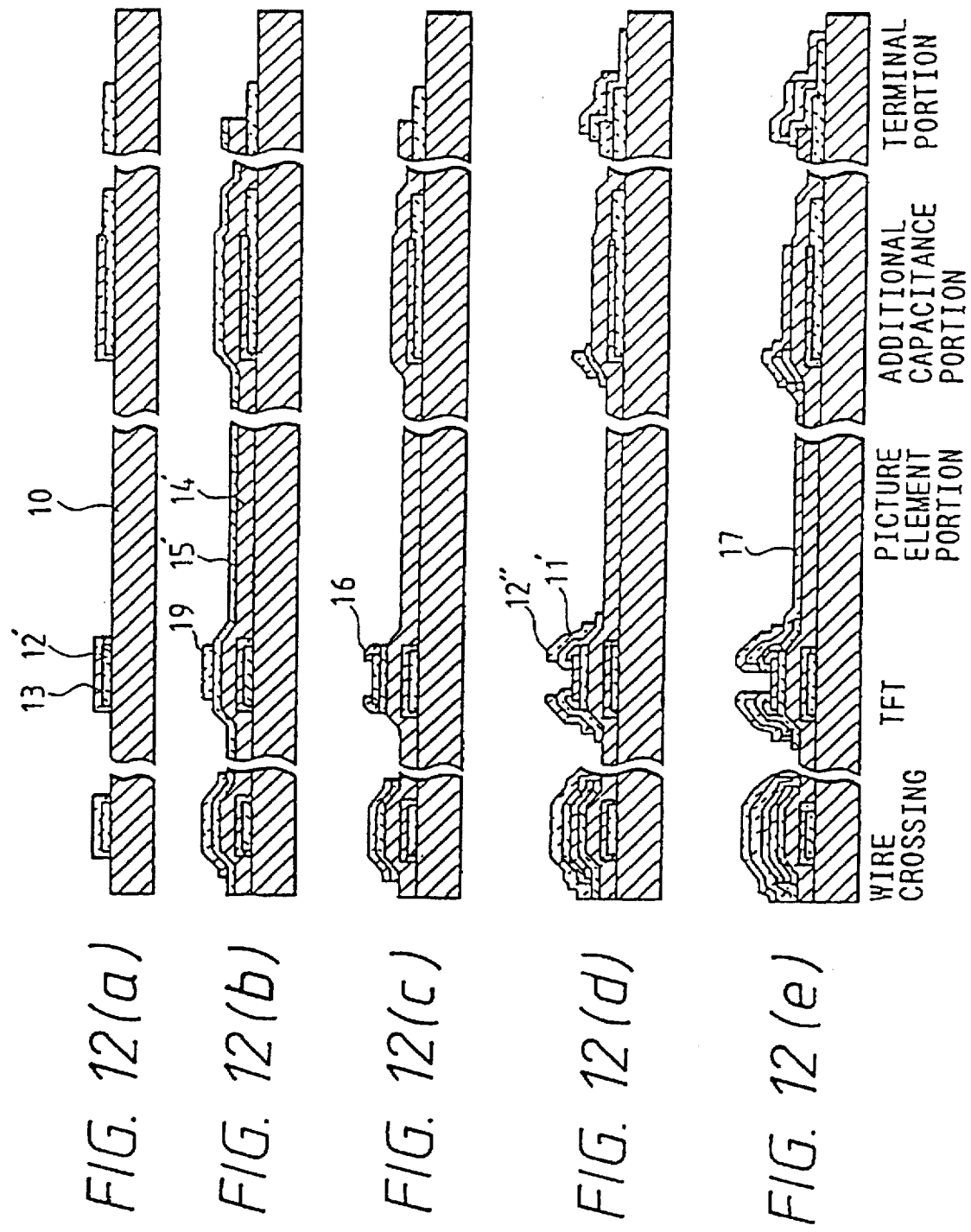

WIRE CROSSING | TFT | PICTURE ELEMENT PORTION | ADDITIONAL CAPACITANCE PORTION | TERMINAL PORTION

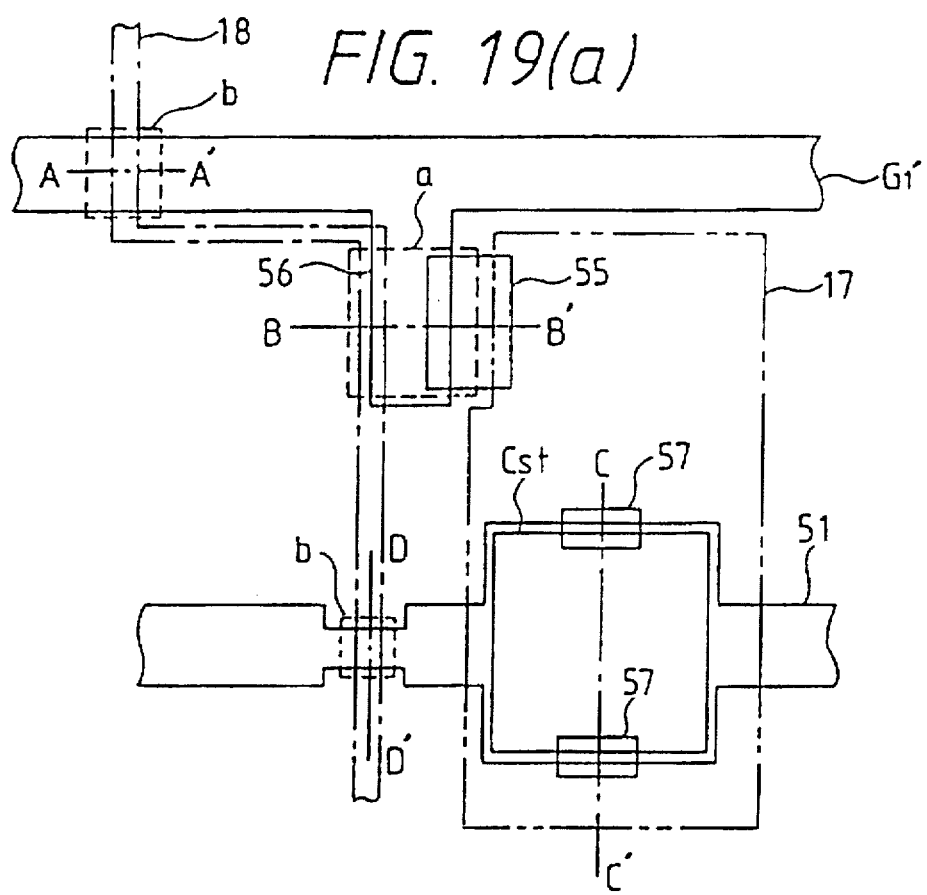
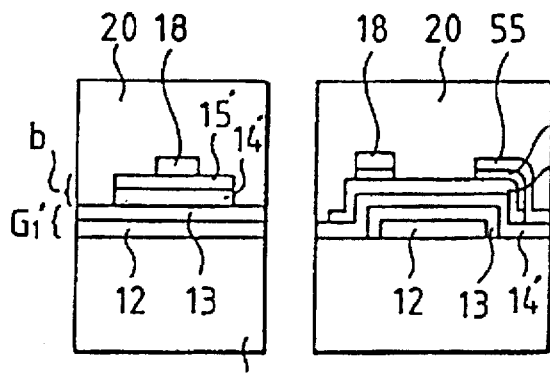
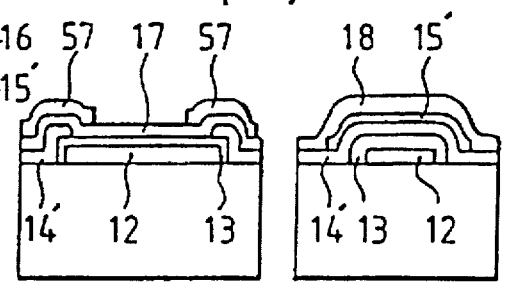

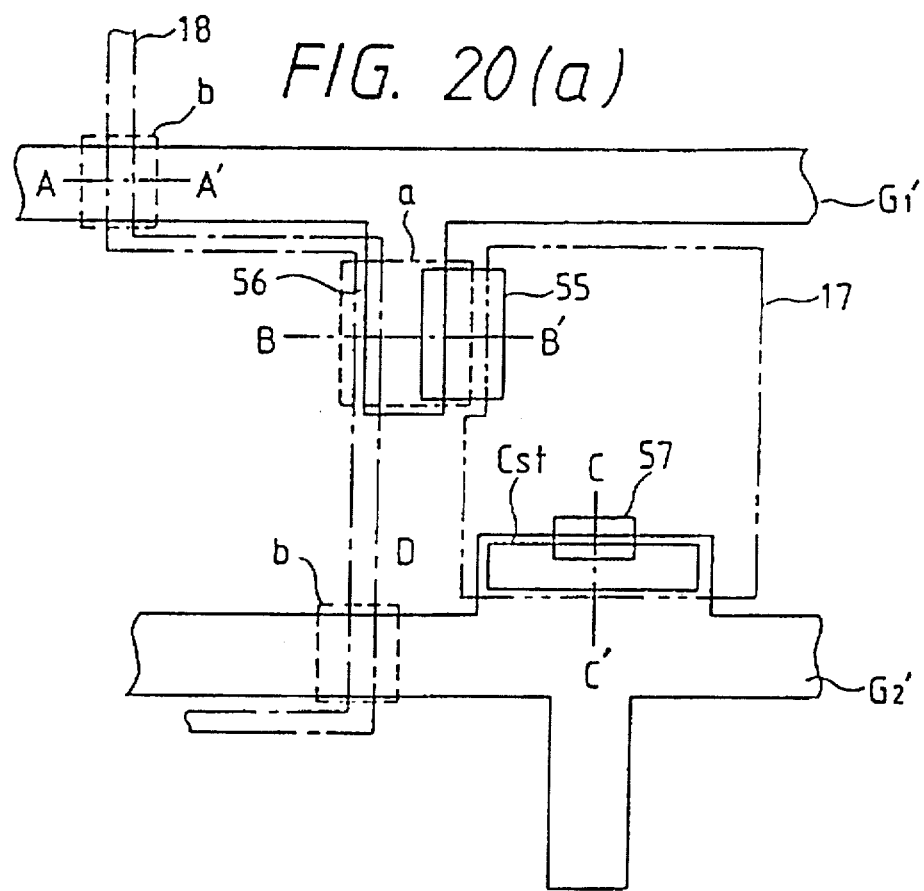
FIG. 20(a)
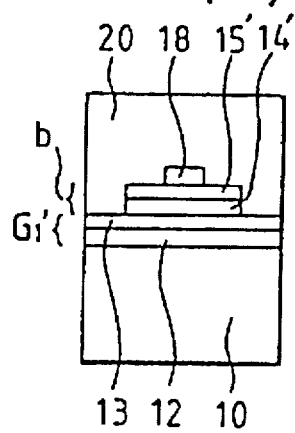
FIG. 20(b)
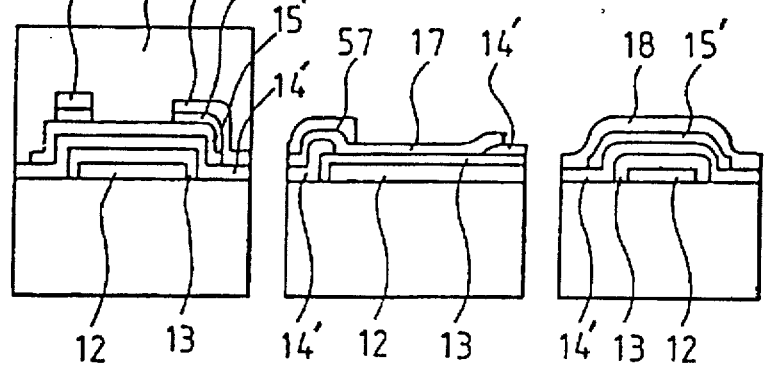
FIG. 20(d)
FIG. 20(c)
FIG. 20(e)

THIN FILM TRANSISTOR SUBSTRATE, MANUFACTURING METHOD THEREOF, LIQUID CRYSTAL DISPLAY PANEL AND LIQUID CRYSTAL DISPLAY EQUIPMENT

This is a continuation of application Ser. No. 08/158,219, filed Nov. 29, 1993, now U.S. Pat. No. 5,585,290 which is a Divisional application of application Ser. No. 07/674,328, filed as PCT/JP90/01039 Aug. 13, 1990, now U.S. Pat. No. 5,359,206, issued Oct. 25, 1994.

(TECHNICAL FIELD)

The present invention concerns an active-matrix addressed TFT substrate using a thin film transistor (hereinafter referred to as TFT), a manufacturing method and an anodic oxidation method thereof, a liquid crystal display panel using the TFT substrate and a liquid crystal display equipment using the liquid crystal display panel.

(BACKGROUND ART)

FIG. 2 shows an example of a TFT substrate for a liquid crystal display panel, using an amorphous silicon (hereinafter simply referred to as a-Si) TFT, using Al as a gate electrode and constituting a portion of a gate insulation film with $Al_2O_3$ obtained by anodic oxidation thereof. FIGS. 2(a), (b) and (c) show, respectively, an equivalent circuit diagram, a plan view and a cross sectional view of the TFT substrate. There are depicted for gate terminals by $G_1$, $G_2$, gate bus-lines by $G_1'$, $G_2'$, drain terminals by $D_1$, $D_2$, TFT by $T_{11}$, $T_{12}$, $T_{21}$, $T_{22}$, liquid crystal by LC, common terminal disposed on the side of the color filter substrate by $V_{com}$. Further, there are also depicted substrate 10, Al 12', $Al_2O_3$ 13, SiN 14, transparent electrode (pixel electrode) 17, non-doped a-Si(i) 15, phosphorus-doped hydrogenated amorphous silicon (hereinafter simply referred to as a-Si(n$^+$)) 16, signal bus-line 18, source electrode 18' connecting the a-Si(n$^+$) TFT and the pixel electrode. In FIG. 2, boundary line $l_1$ indicates the boundary between the regions undergoing and not undergoing the anodic oxidation. With reference to the boundary line $l_1$, the right area is a region undergoing anodic oxidation, while the left area is a region not undergoing the same.

Further, a structure as shown in FIG. 32(a), (b) has been used near the gate electrode of a conventional TFT substrate. FIG. 32(a) is a plan view near the gate electrode and FIG. 32(b) is a cross sectional view taken along line AA' thereof. In the figure, are shown substrate 10, Cr 11, Al 12', SiN 15, a-Si 15', source electrode 55, signal bus-line also serving as the drain electrode 18 and transparent electrode 17 as a pixel electrode.

As shown in the figure, Cr has been used for the gate electrode and SiN has been used for the gate insulator film. On the other hand, two layers of metals of Cr and Al are used for the gate bus-line. The reason why the gate electrode and the gate bus-line are constituted with different materials will now be described below.

At first, the conditions for the metal of the gate electrode are that it has good adhesion with the substrate, has no unevenness at the surface and does not suffer from deterioration in the course of forming SiN as the gate insulation film. Cr is suitable for the conditions. On the other hand, it is demanded for the gate bus-line that the resistance is low. Since Cr has a intrinsic resistivity higher by one or more of orders as compared with Al, it is not suitable to the gate bus-line. On the other hand, A is liable to cause hillocks, tending to cause acicularly protruded defects at the surface.

Further, since there is a problem that the hillocks generate in the step of forming SiN as the gate insulation film (usually deposited by means of a plasma CVD method at a substrate temperature of 200° to 350° C.), it can not be used for the gate electrode. Accordingly, Cr have been used for the gate electrode and metals of two layer structure comprising Cr and Al have been used for the gate bus-line.

On the other hand, there is Ta or Al anodic oxidation technology in the prior art (refer, for example, to Manual of Electrochemistry (Maruzen), p 874–892, published December, 1964). This is a technic of electrochemically oxidizing the surface of metal which has been used for the capacitor or surface coating.

The merit of the oxide film (insulator film) formed by this technic is that it less causes defects due to foreign particles. Accordingly, there has been a prior art of utilizing the above-mentioned technology to TFT (Japanese Patent Laid-Open Sho 58-147069 and 61-133662).

As the prior art relevant to the present invention, there can be mentioned Japanese Patent Laid-Open Sho 63-164 regarding anodic oxidation and Japanese Patent Laid-Open Sho 58-90770 and 58-93092 regarding a storage capacitance.

However, since Al is used for the gate terminal or the gate electrode and only the portion thereof is used by anodic oxidation in the prior art, there are the following problems.

(1) Al is used also to the gate electrode in the conventional TFT substrate as shown in FIG. 2. Usually, the gate terminal of the TFT substrate is used in a state being exposed to atmospheric air. Al is liable to be denatured such by electric-erosion and the use of Al for the gate terminal deteriorates the reliability of the TFT panel.

(2) Since Al results in rod-like crystals referred to as whiskers and hillocks due to thermal stresses and thus brings about surface unevenness, it is not desirable. In particular, whiskers are whisker-like defects each of several tens of micronmeter, which cause, for example, shorts between electrodes.

In this way, the gate terminal in the prior art described above involves a problems in view of the reliability of the gate terminal or the yield upon manufacture due to the occurrence of defects or the like.

Further, (3) the gate bus-line has to be electrically connected with an external circuit at the end thereof. Accordingly, it is necessary for such a device as not anodically oxidizing the portion. It may be considered to cover the portion with a resist so that it may be kept from direct contact with an anodic oxidation solution. However, there is a problem that Al is disconnected along the end of the resist due to the phenomenon attributable to electrostatic breakdown of the resist.

(4) In a case of using a positive type photoresist as a mask for anodic oxidation, there has been a problem that defects such as dissolving of Al are caused at the intersection between the Al pattern and the mask pattern for anodic oxidation.

(5) It is desirable that the film thickness of $Al_2O_3$ is as thin as possible in view of the mutual conductance gm of TFT. On the other hand, an increased thickness is desired in view of the breakdown voltage. There has been a problem that the film thickness is not optimized.

(DISCLOSURE OF THE INVENTION)

The first object of the present invention is to provide a TFT substrate of high reliability and with improved yield upon manufacture.

A second object of the present invention is to provide a method of manufacturing such a TFT substrate.

A third object of the present invention is to provide a liquid crystal display panel using such a TFT substrate.

A fourth object of the present invention is to provide an anodic oxidation method causing no defect in an Al pattern upon anodic oxidation.

A fifth object of the present invention is to provide a liquid crystal display equipment using the liquid crystal display panel described above.

The first object as described above can be attained in (1) a thin film transistor substrate at least having a plurality of gate terminals disposed on an insulative substrate, a plurality of gate bus-lines electrically connected therewith, a plurality of signal bus-lines disposed in intersection with the plurality of gate bus-lines, a plurality of thin film transistors arranged in a matrix-like form and a plurality of thin film capacitances, wherein the gate terminal has a layer at least comprising chromium or tantalum, a gate bus-line pattern constituted with the gate bus-line, a gate electrode of the thin film transistor and the thin film capacitance comprises aluminum or a metal mainly composed of Al and a desired portion at the surface of the gate bus-line pattern is covered with an anodic oxidized film, (2) a thin film transistor substrate as defined in (1) above, wherein the gate bus-line is connected with the gate terminal at the upper portion of the top end thereof, (3) a thin film transistor substrate as defined in (2) above, wherein the connection portion of the gate bus-line with the gate terminal is a stripe-pattern with a line width of not greater than 20 μm, (4) a thin film transistor substrate as defined in (1) above, wherein the metal mainly composed of aluminum is a metal mainly composed of aluminum and containing Pd or Si, (5) a thin film transistor substrate as defined in (1) above, wherein the semiconductor layer constituting the thin film transistor comprises amorphous silicon and the gate insulator comprises the anodic oxidized film and a silicon nitride film, (6) a thin film transistor substrate as defined in (1) above, wherein the anodic oxidized film has a thickness within a range from 1100 Å to 2200 Å, (7) a thin film transistor substrate having an insulative substrate, a plurality of gate terminals disposed on the insulative substrate, a plurality of gate bus-lines connected electrically with the plurality of gate terminals, a plurality of signal bus-lines disposed in intersection with the plurality of gate bus-lines, a plurality of thin film transistors and a plurality of thin film capacitances, wherein the gate bus-lines and gate electrodes for the thin film transistors comprise of aluminum or a metal mainly composed of aluminum, at least one of films of a group consisting of the gate insulator of the thin film transistor, the insulation film at the intersection between the gate bus-lines and the signal bus-lines and the dielectric film constituting the thin film capacitance is a film containing an anodic oxidized film of aluminum or a metal mainly composed of aluminum, and the thickness of the anodic oxidized film is within a range from 1100 to 2200 Å, (8) a thin film transistor substrate as defined in (7) above, wherein the gate terminal comprises a conductor layer containing a layer made of chromium, (9) a thin film transistor substrate as defined in (7) above, wherein the gate insulator of the thin film transistor is a composite film comprising the anodic oxidized film and an insulation film of different kind from that of the anodic oxidized film, (10) a thin film transistor substrate as defined in (9) above, wherein the insulation film of the different kind is a silicon nitride film and the film thickness is within a range from 1200 to 2000 Å, (11) a thin film transistor substrate as defined in (9) above, wherein the insulation film of the different kind is a silicon oxide film and the film thickness is within a 1200 to 2000 Å, (12) a thin film transistor substrate as defined in (7) above, wherein the material constituting the active layer of the thin film transistor is hydrogenated amorphous silicon, (13) a thin film transistor substrate as defined in (7) above, wherein the insulation film at the intersection between the gate bus-line and the signal bus-line comprises the anodic oxidized film, the insulation film of material different from that of the anodic oxidized film and a hydrogenated amorphous silicon film, (14) a thin film transistor substrate as defined in (7) above, wherein the dielectric film constituting the thin film capacitance comprises the anodic oxidized film and the insulation film made of material different from that of the anodic oxidized film, (15) a thin film transistor substrate as defined in (7) above, wherein the dielectric film constituting the thin film capacitance comprises the anodic oxidized film, (16) a thin film transistor substrate as defined in (7) above, wherein the gate bus-line is connected with the gate terminal in the upper portion at the top end thereof, (17) a thin film transistor substrate as defined in (16) above, wherein the connection portion of the gate bus-line with the gate terminal is a stripe-like pattern with a line width of not greater than 20 μm, (18) a thin film transistor substrate as defined in (16) above, wherein the connection portion of the gate bus-line with the gate terminal is a stripe-like pattern with a line width of not greater than 10 μm.

The second object can be attained by (19) a method of manufacturing a thin film transistor substrate comprising a first step of forming a gate electrode made of chromium or tantalum on a substrate, a second step of forming a gate bus-line pattern comprising a gate bus-line to be connected with the gate terminal, a gate electrode of a thin film transistor and a thin film capacitance with aluminum or a metal mainly composed of aluminum, a third step of covering the gate terminal and the connection portion between the gate terminal and the gate bus-line with a photoresist, and a fourth step of anodically oxidizing the gate bus-line pattern and rendering the surface of a desired portion of the gate bus-line pattern into an anodic oxidized film, (20) a method of manufacturing a thin film transistor substrate as defined in (19) above, wherein the third step includes steps of coating the photoresist, pre-baking, exposure, post-baking and development, (21) a method of manufacturing a thin film transistor substrate as defined in (19) above, wherein the fourth step includes a step of conducting anodic oxidation at a constant current and anodic oxidation at a constant voltage, (22) a method of manufacturing a thin film transistor substrate as defined in (19) above, wherein the gate bus-line pattern comprises two or more patterns the respective portions of which constituting them are connected in common on every desired portions and not connected to each other and the fourth step conducts the anodic oxidation at a different voltage on each of the patterns, (23) a method of manufacturing a thin film transistor substrate as defined in (19) above, wherein a fifth step of applying a heat treatment to the anodic oxidized film at a temperature within a range from 200° C. to 350° C. is disposed after the fourth step, (24) a method of manufacturing a thin film transistor substrate as defined in (19) above, wherein the metal mainly composed of aluminum is a metal comprising aluminum as the essential ingredient and also containing Pd or Si, (25) a method of manufacturing a thin film transistor substrate as defined in (19) above, wherein the desired portion to be formed with the anodic oxidized film at the surface by the fourth step is at least the gate electrode of the thin film transistor, the thin film capacitance and the portion of the gate bus-line intersecting the signal bus-line, (26) a method of manufacturing a thin film transistor substrate of forming a pattern including at least a plurality of gate bus-lines and gate electrodes of a plurality of thin film transistors with aluminum or a metal mainly composed of aluminum on an insulative substrate, and anodically oxidizing a desired portion of the aluminum or the metal mainly composed of aluminum into an anodic oxidized film, wherein the thickness of the anodic oxidized film is within a range from 1100 to 2200 Å, and the anodic oxidation is conducted to at least only one of the gate electrode of the thin film transistor, intersecting portion of the gate bus-line with the signal bus-line and the thin film capacitance, (27) a method of manufacturing a thin film transistor substrate as defined in (26) above, wherein the gate bus-line is electrically connected with the gate terminal made of chromium, and the anodic oxidation is conducted by applying a voltage through the gate terminal.

The third object can be attained by (28) a liquid crystal display panel comprising (1) a thin film transistor substrate at least comprising a plurality of gate terminals disposed on the insulative substrate and having at least a layer made of chromium or tantalum, a plurality of bus-lines electrically connected therewith, a plurality of bus-lines disposed in intersection with the plurality of gate bus-lines, a plurality of thin film transistors disposed in a matrix-like configuration, and a plurality of thin film capacitance, in which a gate bus-line pattern constituted with the gate bus-line, the gate electrode of the thin film transistor and the thin film capacitance made of aluminum or a metal mainly composed of aluminum, and the desired portion at the surface of the gate bus-line pattern is covered with the anodic oxidized film, (2) a light permeable substrate disposed thereto and having at least a common electrode and (3) a liquid crystal display panel having liquid crystals put therebetween, (29) a liquid crystal display panel comprising (1) a thin film transistor substrate comprising an insulative substrate, a plurality of gate terminals disposed on the insulative substrate, a plurality of gate bus-lines electrically connected with the plurality of gate terminals, a plurality of signal bus-lines disposed in intersection with the plurality of gate bus-lines, a plurality of thin film transistors and a plurality of thin film capacitances, in which the gate bus-lines and gate electrodes of the thin film transistors are made of aluminum or a metal mainly composed of aluminum, at least one of films of a group consisting of the gate insulator of the thin film transistor, the insulation film at the intersection between the gate bus-lines and the signal bus-lines and the dielectric film constituting the thin film capacitance is a film containing an anodic oxidized film of aluminum or a metal mainly composed of aluminum and the film thickness of the anodic oxidized film is within a range of from 1100 to 2200 Å, (2) a light permeable substrate disposed in opposition thereto and at least having a common electrode and (3) liquid crystals put therebetween.

The fourth objects can be attained by (30) an anodic oxidation method at least having a step of forming aluminum or a metal mainly composed of aluminum into a desired pattern on an insulative substrate, a step of forming a positive type photoresist pattern on a desired region of the desired pattern as a mask for selective oxidation, and a step of forming aluminum oxide by anodic oxidation on the desired pattern, wherein the positive photoresist pattern is formed under the following condition, with the angle θ formed between the contour line for the pattern of the thus formed aluminum oxide and the desired pattern on the side where aluminum or the metal mainly composed of aluminum is exposed as:

$\theta \geq 110-20T$ assuming the film thickness of the positive type photoresist as T by the unit of μm, (31) an anodic oxidation method as defined in (30) above, wherein the thickness of the photoresist is made greater than 1.5 μm, (32) an anodic oxidation method as defined in (30) above, wherein the post baking temperature for the photoresist is within a range from 110° C. to 160° C., (33) an anodic oxidation method as defined in (30), wherein the post baking time for the photoresist is within a range from 5 to 40 min, (34) an anodic oxidation method at least having a step of forming aluminum or a metal mainly composed of aluminum into a desired pattern on an insulative substrate, a step of forming a negative type photoresist pattern on a desired region on the desired pattern as a mask for selective oxidation, and a step of forming aluminum oxide by anodic oxidation on the desired pattern, wherein a negative photoresist pattern is formed under the condition that the angle θ formed between the contour line of the thus formed aluminum oxide and the desired pattern, on the side where aluminum or the metal mainly composed of aluminum is exposed, is smaller than 90°, (35) an anodic oxidation method as defined in (34), wherein the film thickness of the photoresist is made greater than 1.5 μm, (36) an anodic oxidation method as defined in (34) above, wherein the post baking temperature for the photoresist is within a range from 110° C. to 160° C., (37) an anodic oxidation method as defined in (34) above, wherein the post baking time for the photoresist is within a range from 5 to 40 min.

The fifth object can be attained by (38) a liquid crystal display equipment comprising (1) a liquid crystal display panel comprising a thin film transistor substrate at least having a plurality of gate terminals disposed on an insulative substrate and having at least a layer comprising chromium or tantalum, a plurality of gate bus-lines electrically connected therewith, a plurality of signal bus-lines disposed in intersection with the plurality of gate bus-lines, a plurality of thin film transistors arranged in a matrix-like configuration and a plurality of thin film capacitances, in which a gate bus-line pattern constituted with the gate bus-lines, the gate electrode of the thin film transistors and the thin film capacitance is made of aluminum or a metal mainly composed of aluminum, and a desired portion of the surface of the gate bus-line pattern is covered with the anodic oxidized film, a light permeable substrate opposed thereto and at least having a common electrode, and liquid crystals put therebetween, (2) a video signal driving circuit for providing a video signal to the liquid crystal display panel, (3) a scanning circuit for providing a scanning signal to the liquid crystal display panel, and (4) a control circuit for applying information for the liquid crystal display panel to the video signal driving circuit and the scanning circuit, (39) a liquid crystal display equipment comprising (1) a liquid crystal display panel comprising a thin film transistor substrate having an insulative substrate, a plurality of gate terminals disposed on the insulative substrate, a plurality of gate bus-lines electrically connected with the plurality of gate terminals, a plurality of signal bus-lines disposed in intersection with the plurality of gate bus-lines, a plurality of thin film transistors and a plurality of thin film capacitances, in which the gate bus-line and the gate electrode of the thin film transistor are made of aluminum or a metal mainly composed of aluminum, at least one of films of a group consisting of the gate insulator of the thin film transistor, the insulation film at the intersection between the gate bus-line and the signal bus line and the dielectric film constituting the thin film capacitance is a film containing an anodic oxidized film of aluminum or the metal mainly composed of aluminum, and the thickness of the anodic oxidized film is within a range from 1100 to 2200 Å, a light permeable substrate opposed thereto and at least having a common electrode, a liquid crystal display panel having liquid crystals put therebetween, (2) a video signal driving circuit for providing a video signal to the liquid crystal display panel, (3) a scanning circuit for providing a scanning signal to the liquid crystal display panel and (4) a control circuit for applying information for the liquid crystal display panel to the video signal driving circuit and the scanning circuit.

In the present invention, Cr or Ta is used for the gate terminal and connected at the top end of the gate terminal with Al or a metal mainly composed of Al as the gate bus-line. Since Al is liable to be denatured due to thermal stresses, it is preferred to use a metal comprising Al and less than 1% (at % here and hereinafter) of Pd or Si added thereto in order to provide a thermal stress resistance. Hereinafter, such Al is described as Al(Pd), Al(Si). The Al(Pd), Al(Si) can be anodically oxidized like that Al and form $Al_2O_3$ like that with pure Al. Addition of Si or Pd in excess of 1%, is not undesirably since the breakdown voltage of the resultant $Al_2O_3$ is reduced. A preferred addition amount of Si or Pd is not less than 0.01% and, particularly, within a range from 0.1 to 0.3%. Comparing Al(Pd) and Al(Si), the formed anodic oxidation film is higher by about 30% in the former and Al(Pd) is more preferred.

Further, when $Al_2O_3$ is used as the gate insulator film for TFT, it is desirable that the thickness of the $Al_2O_3$ is as thin as possible in view of the mutual conductance, while it is desirable to increase the thickness in view of the electrostatic breakdown. Accordingly, a preferred film thickness is within a range from 1100 to 2200 Å and, more preferably, the film thickness is within a range from 1100 Å to 2100 Å.

Although hillock resistance could be improved, whisker could not be prevented with such Al(Pd), Al(Si). As a result of a study, it has been found that the whiskers can be prevented by making the width of the bus-line to less than 20 µm as shown in Table 1. Usually, about 100 µm width is often used for Al bus-line, and, it is preferred that the line end of the connection point between Cr or Ta and Al, Al(Pd) or Al(Si) is made into a stripe-like shape having a width of less than 20 µm. This can completely prevent occurrence of whisker. Further, the line width of the stripe is desirably more than 5 µm.

TABLE 1

| Al line width (µM) | Whisker density (piece/cm³) |
|---|---|
| 70 | 5 × 10⁻⁶ |
| 30 | 3 × 10⁻⁶ |
| 20 | 0 |
| 10 | 0 |

In a case where there are two kind of metals, that is, Cr and Al or a metal mainly comprising Al upon anodic oxidation as in the present invention, if an overlapped portion of Cr and Al or a metal mainly composed of Al is in contact with an anodic oxidation solution, Cr in that portion dissolves by electrochamical reaction to eliminate the portion and result in gate disconnection. In a case of using Ta instead of Cr, since there is a difference between the volumetric expansion coefficient in changing from Al into $Al_2O_3$ and the volumetric expansion coefficient in changing from Ta into $Ta_2O_5$, peeling occurs near the boundary between $Ta_2O_5$ and $Al_2O_3$, to possibly cause gate disconnection. Accordingly, it is necessary to apply anodic oxidation after completely covering such a portion with the photoresist.

Further, in the method of manufacturing the TFT substrate according to the present invention, a more preferred manufacturing method is a method of conducting a post-heat treatment (post baking) for the photoresist before development upon forming the photoresist pattern carried out before anodic oxidation. That is, the pattern formation of the photoresist is usually conducted in the order of:

(1) photoresist coating,
(2) pre-heat treatment (pre-baking),
(3) exposure,
(4) development, and
(5) post-heat treatment (post-baking)

In this case, if the photoresist remains in the development, the residue is fixed by baking in the post heat treatment. Further, if obstacles in the furnace or obstacles at the periphery of the substrate are moved and deposited to the surface to be oxidized, the anodic oxidation solution can not intrude and anodic oxidation films can not be formed in this portion. Accordingly, the metal is exposed in the portion, causing short circuit. Accordingly, it is preferred to conduct the procedures in the following order:

(1) photoresist coating,
(2) pre-heat treatment (pre-baking)
(3) exposure,
(4) post heat treatment (post baking) and
(5) development The function of the present invention will be explained next.

(1) Cr or Ta is resistive to electric erosion even in atmospheric air to improve the reliability.
(2) If Al containing less than 1% of Pd or Si is used instead of Al, hillock or migration is improved and the reliability is further enhanced.
(3) For the connection portion of the gate bus-lines with the gate terminals, if the portion for Al is made into a fine line with a line width of less than 20 µm, no whisker is formed. Accordingly, the yield is improved.

Further, the anodic oxidation method according to the present invention has the following effect. A positive type resist is often used in a usual semiconductor process as a masking material for conducting anodic oxidation selectively. If anodic oxidation is applied while applying masking such that the resist intersects the Al pattern, oxidation may proceed and, in the worst case, Al may be dissolved also under the resist mask at the intersections between the patterns. This dues to the unsatisfactory breakdown voltage of the masking photoresist. It has been found that the unsatisfactory breakdown voltage can not be compensated sufficiently by merely increasing the thickness of the resist. In a case where the pattern of the photoresist is laid over the pattern of Al or a metal mainly comprising Al selectively, it has been found that if the angle of the pattern for the portion in which Al and the resist are overlapped to each other (the portion in which Al is present on the surface after anodic oxidation) is less than 90°, halation occurs at the edges of the Al pattern upon irradiation of UV-rays for the patterning of the resist, which reduces the thickness of the resist film in the vicinity thereof and causes unsatisfactory breakdown voltage. In other word, for the photoresist pattern for masking relative to the pattern of the oxidized portion of Al or a metal mainly composed of Al it has been found that if the angle made between Al and the resist formed to the outside of the pattern is less than 90°, when UV-rays are irradiated for the patterning of the resist, the film thickness of the resist in the vicinity thereof is reduced due to the halation at the edges of the Al pattern to cause unsatisfactory or filled breakdown voltage. In view of the above, it has been found that the effect of halation light at the Al pattern edge upon exposure of the photoresist is eliminated to avoid the reduction of the film thickness in the photoresist by enlarging the angle between Al of the oxidized portion formed to the outside of the pattern relative to the pattern of the oxidized portion of Al or a metal mainly composed of Al, by which a sufficient breakdown voltage is provided. As a result, defects upon anodic oxidation (unnecessary oxidation and dissolution of Al under the photoresist) can be eliminated.

The experimental examples described above will now be explained referring to FIG. 21 and FIG. 22.

Al 12' is deposited, for instance, by a vacuum vapor deposition method to a film thicknees of 0.2 μm on an insulative substrate 10, which was patterned by a usual photoetching method. Subsequently, a positive type photoresist PR was coated to a thickness of 2 μm and UV-rays were selectively irradiated and exposed by using a desired photomask. It was developed into a shape shown in FIG. 21.

FIG. 22 is a view illustrating the result of an experiment when the pattern of the photoresist was varied, in which the abscissa indicates angles $\theta_1$ and $\theta_2$ to the outside between the pattern of the photoresist for the masking and the pattern of Al in the oxidized portion (angle θ at an overlapped portion of Al and resist, expressed on Al hereinafter simply referred to as an external angle). Expressing it as a shape after the anodic oxidation, it is an angle formed between the contour line of the oxidized aluminum pattern and a not oxidized Al pattern on the Al pattern, that is, an angle on the side where Al is exposed without oxidation. Further, the ordinate indicates the occurrence of defect upon anodic oxidation, and the parameter in the figure means the film thickness of the photoresist for masking.

As apparent from the result of the experiment, the occurrence of defect is increased as the thickness of the photoresist film is reduced and the external angle is smaller. If the thickness of the photoresist film is 2.6 μm, the defect is reduced to 0 at an angle of 60°. If the thickness of the photoresist film is 1 μm, there is a possibility for the occurrence of defect even if the angle is 90°. It can be seen that more than 1.5 μm of the thickness is required for the photoresist film in order that the possibility for the occurrence of defect is eliminated at all with an angle of 90°. Further, it can also be seen from the result that a greater angle provides higher safety.

FIG. 23 shows the occurrence of defect upon anodic oxidation due to the effect of halation light in the positive type photoresist by means of a relationship between the thickness of the resist film and θ shown in FIG. 21. In FIG. 23, the abscissa indicates the thickness of the resist film and the ordinate indicates θ. In the figure, the area above the line:

$$T\theta = 110 - 20T$$

shows a region with no occurrence of defect assuming T as the thickness of the resist film.

The foregoing explanation is applied to a case of using the positive type resist for the anodic oxidation mask. The photochemical reaction is reversed in the negative type resist. That is, photo-induced molecular reduction occurs with the positive type, while photo-induced polymerization occurs with the negative type. Accordingly, the effect of the halation light is reversed in the negative type. That is, in the negative type, a photoresist, which should not be present, remains a little at the periphery of the Al pattern by the halation light. Since the resist is particularly thin, dielectric breakdown voltage is low and the defect is caused upon anodic oxidation. In the negative type, the mechanism of causing the residue of thin resist with low dielectric breakdown voltage is different from that in the positive type, but defects are caused by the effect of the halation light in both of them. It has been confirmed for the negative type that the effect of the halation light at the Al pattern edge can be eliminated and no additional residue of the photoresist film is not caused upon exposure to the photoresist by reducing the angle formed between Al and the resist pattern to the outside of the Al pattern to less than 90° relative to the pattern of the oxide portion of Al or metal mainly composed of Al.

That is, in the negative type, the external angle is preferably less than 90°. It has also been found that a sufficient breakdown can be provided in this case.

FIG. 24 shows an example of an experiment made for the post baking treatment of the positive type photoresist before anodic oxidation.

In FIG. 24, the abscissa shows a post baking temperature. The ordinate shows occurrence of defect. The thickness of the resist film is shown for the case of 2.8 μm.

Further, the parameter is an angle formed to the outer side between the pattern of the photoresist for masking and the Al pattern described before (external angle). From the result of the experiment, it can be seen that the defect is increased as the post-baking temperature is lower. Separately from the experiment, if the photobaking intensity or strength is too strong, there occurs a defect of inducing cracks in the photoresist. The limit for the post-baking strength is (1) 160° C. for the temperature and (2) 40 min for the time.

Further, if the post-baking strength is too small, defect is increased and the lower limit thereof is (1) 120° C. for the temperature and (2) 5 min for the time.

There was no difference for the effect of the post-baking strength between the negative type and the positive type.

When the external angle (θ) at the limit of the occurrence of defect is determined as a function of the film thickness (T) of the positive type resist based on the knowledge obtained by the foregoing experiment, the external angle is:

$$\theta = 110 - 20T$$

as shown in FIG. 24 (obtainable from the data shown in FIG. 22).

This equation determines the limit at which the resist causes photochemical reaction under the effect of the halation light in the Al pattern edge.

That is, in the positive type photoresist, a region with an angle greater than the angle obtained according to the equation is a region free from the occurrence of defect.

The maximum coating thickness of the photoresist in the usual photo process is about 5 μm. The breakdown voltage of the resist with the film thickness was 250 V. Accordingly, there is an upper limit for increasing the voltage of anodization and it is desirably lower than 200 V. The thickness of the $Al_2O_3$ film formed at the upper limit 200 V was about 280 nm.

Although the foregoing explanations have been made to a case of using pure Al for the Al pattern, it has been found that Al(Si) or Al(Pd) material incorporated with a small amount of Si or Pd by less than several % into Al can also be anodically oxidized with no defects by the method as described above to obtain $Al_2O_3$. That is, the present invention provides a technique which can be applied not only to pure Al but also generally to Al alloy materials.

(BRIEF DESCRIPTION OF THE DRAWINGS)

FIGS. 12(A)–12(E) are a cross sectional view illustrating manufacturing steps thereof, FIGS. 18(A)–18(F), FIGS. 19(A)–19(E) and FIGS. 20(A)–20(E) are a cross sectional view and a plan view near the TFT portion of a TFT substrate in a further embodiment according to the present invention.

(BEST MODE FOR CARRYING OUT THE INVENTION)

The present invention will now be described more in details by way of examples.

EXAMPLE 1

Figure 1A:
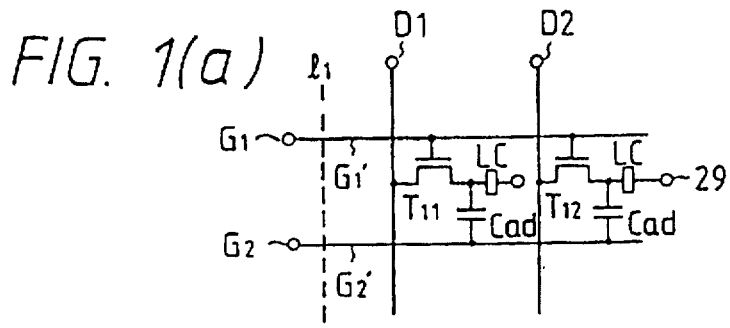
FIGS. 1(A)-1(D) are an equivalent circuit diagram, a plan view, an enlarged plan view and a cross sectional for a portion of a TFT substrate as one embodiment according to the present invention.
Figure 1B:
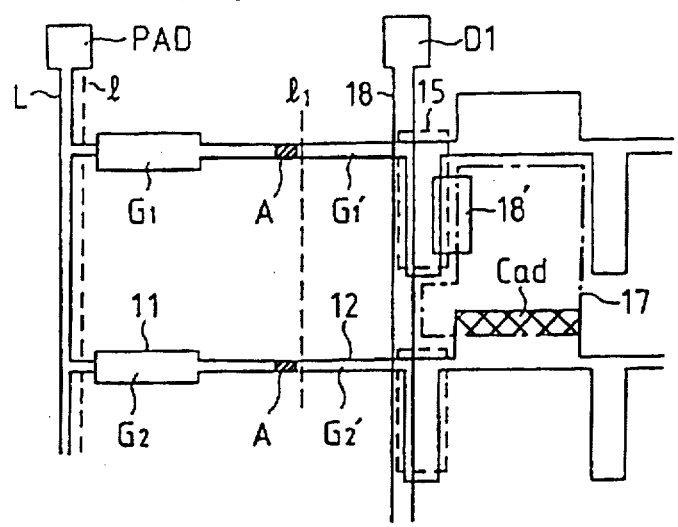
Figure 1C:
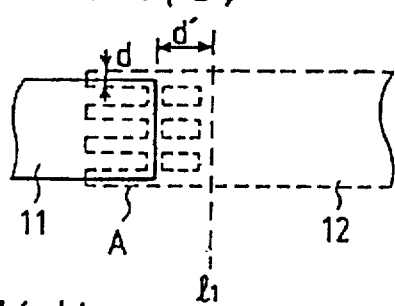
Figure 1D:
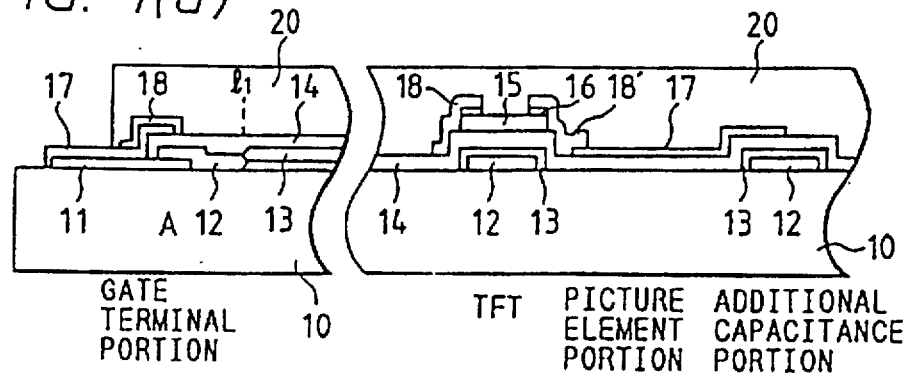
Figure 2A:
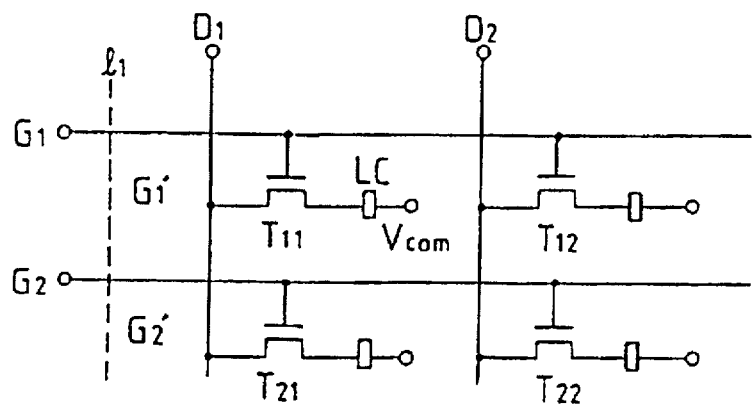
FIGS. 2(A)–2(C) are an equivalent circuit diagram, a plan view and a cross sectional view of a conventional TFT substrate.
Figure 2B:
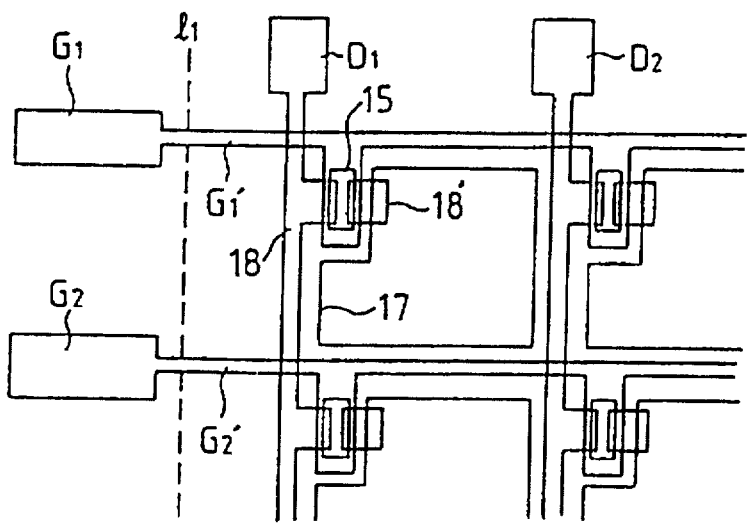
Figure 2C:
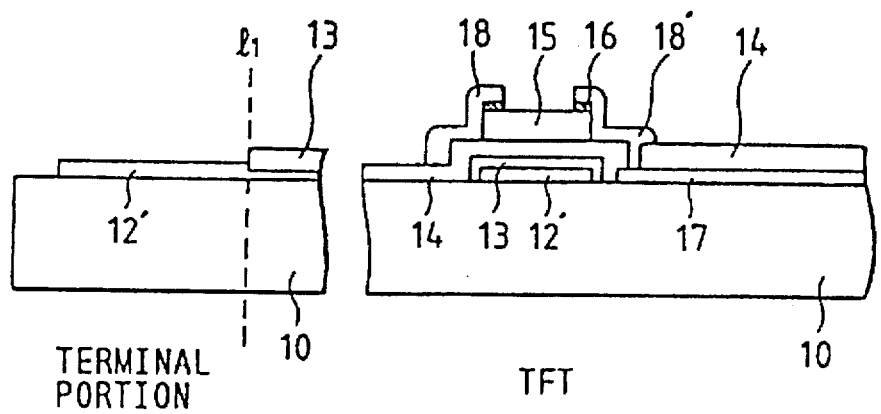

FIG. 1(a) is an equivalent circuit diagram of a TFT substrate as one embodiment according to the present invention, FIG. 1(b) is a plan view thereof, FIG. 1(c) is an enlarged plan view for a region A and FIG. 1(d) is a cross-sectional view thereof. There are depicted an additional capacitance Cad, a pad for anodic oxidation by PAD, a cutting line l, an anodic oxidation bus-line L and a protection film 20 comprising SiN. Other references are the same as those explained referring to FIG. 2 previously.

Description will now be made at first to the manufacturing method of the TFT substrate. Cr 11 is vapor deposited to a thickness of about 1000 Å by means of sputtering on a substrate 10 and gate terminals $G_1$, $G_2$ are formed by photoetching (etching using photoresist as a mask). Then, Al(Pd) 12 (Pd addition amount of 0.1%) is vapor deposited thereover to a thickness of 2800 Å by means of sputtering and gate bus-lines $G_1'$, $G_2'$, additional capacitance Cad and a gate electrode pattern of Al(Pd) are formed by photoetching.

The gate bus-lines $G_1'$, $G_2'$ and the gate terminals $G_1$, $G_2$ are connected in regions A indicated with hatched lines. The pattern in the region A has a stripe-like shape with a line width (d) of Al(Pd) of less than 20 μm as shown in FIG. 1(c). This is effective for preventing whiskers. Subsequently, they are covered with a photoresist excepting for the portion to be anodically oxidized (right side of the boundary line $l_1$ in the figure) and an anodic oxidation pad PAD. In FIG. 1(c), d' represents a distance between the photoresist end and Cr 11 of the gate terminal.

Since Cr is leached out by an electrochemical reaction if it is in contact with an anodic oxidation solution as described above, it is kept from contact with the anodic oxidation solution. On the other hand, the anodic oxidation solution penetrates from the boundary between the photoresist and Al(Pd) even if the photoresist coating is applied. The penetrating distance is about 100 μm. Accordingly, d' is defined to greater than 100 μm.

Figure 4:
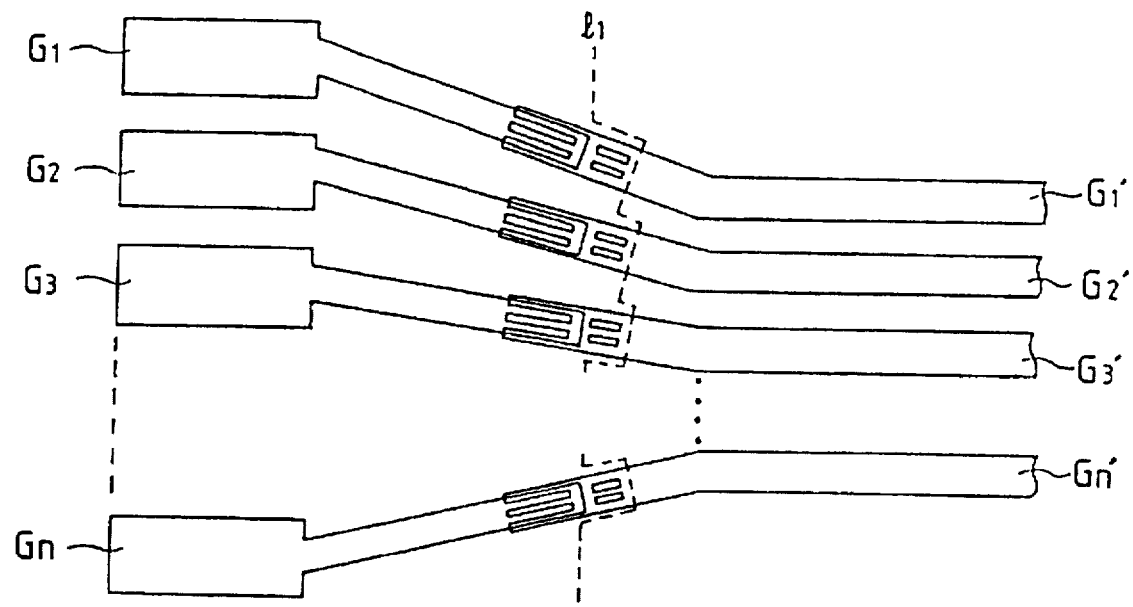
FIG. 4 and FIG. 5 are plan views illustrating the state of intersection between gate bus-lines and photoresist ends.
Figure 5:
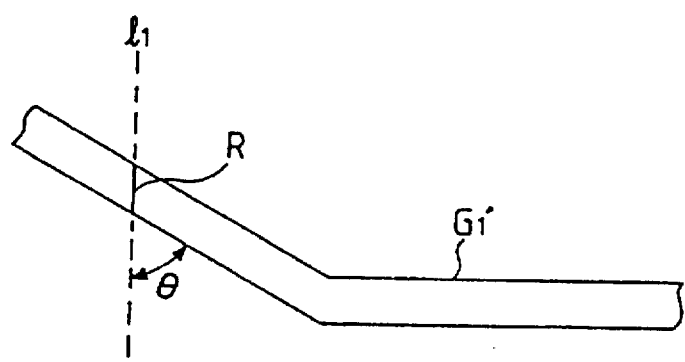

The gate bus-lines $G_1'$, $G_2'$, $G_3'$ - - - $G_n'$ of Al(Pd) and the photoresist end are made in perpendicular to each other as shown in FIG. 4. If $G_1'$ and $l_1$ intersect to each other with an acute angle (θ) as shown in FIG. 5, Al(Pd) is leached out upon anodic oxidation at a portion shown by R in the figure to disconnect the bus-line line, because the film thickness at the end face of the positive type photoresist is reduced by halation at the side wall of Al(Pd) to eliminate the breakdown voltage. Further, the gate terminals $G_1$, $G_2$, $G_3$, - - - $G_n$ are connected in common by means of an anodic oxidation bus-line L, and an anodic oxidation pad PAD is disposed at the top end of the anodic oxidation bus-line L for supplying a voltage for the anodic oxidation. The anodic oxidation bus-line L is formed with Al(Pd) 12. The anodic oxidation is conducted in this state.

Figure 6:
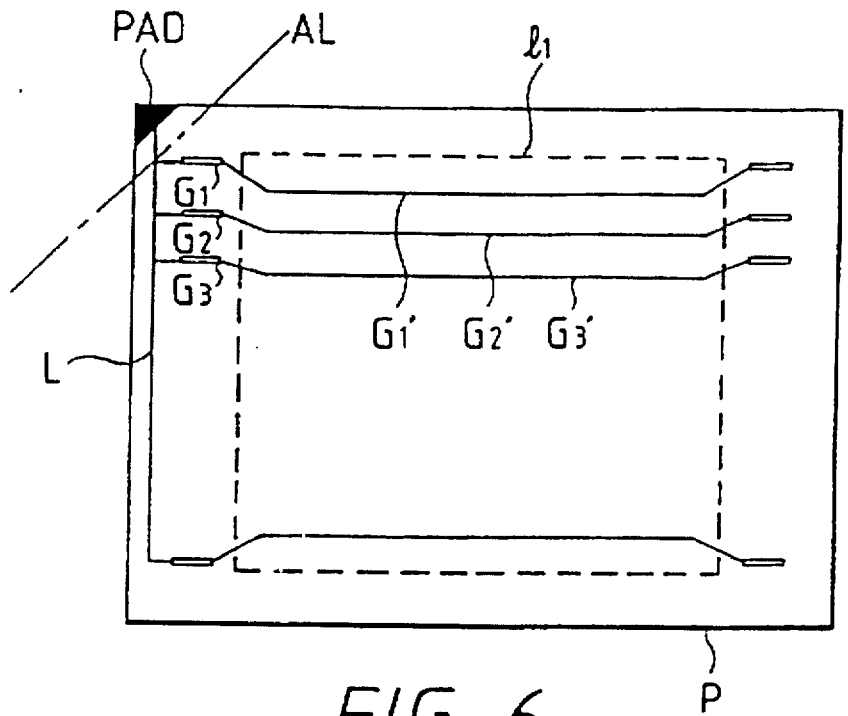
FIG. 6 and FIG. 7 are entire plan views for one embodiment of the TFT substrate according to the present invention.
Figure 7:
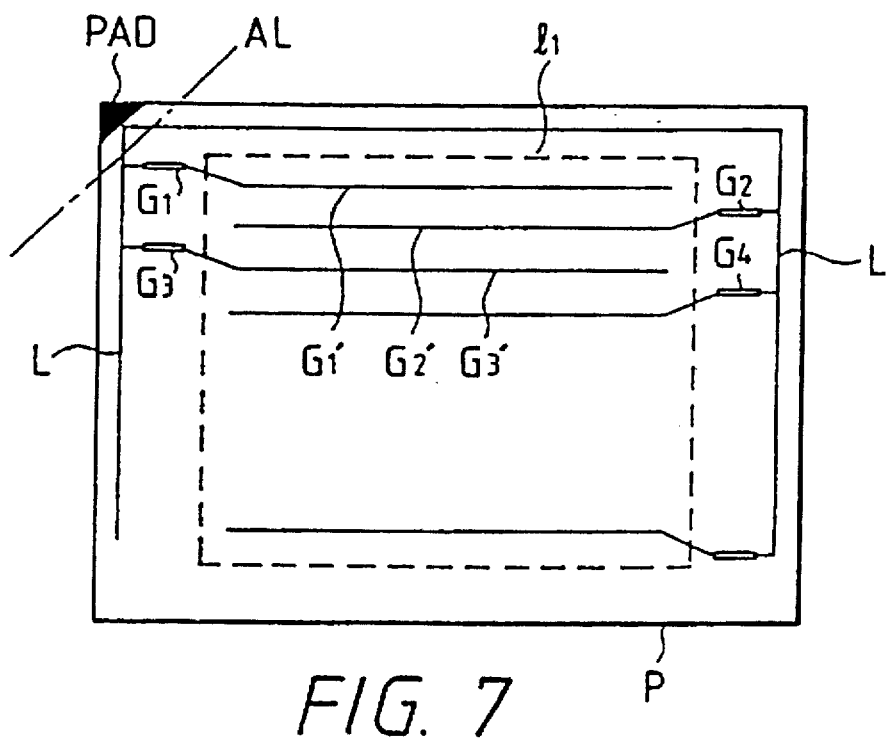

FIG. 6 and FIG. 7 show the entire TFT substrate. FIG. 6 shows a case in which the gate terminals are connected in common by the anodic oxidation bus-line L on the left, from which a voltage for the anodic oxidation is supplied. The anodic oxidation pad PAD and the anodic oxidation bus-line L are formed at the same time by using Al(Pd) for the gate has line. The inside of the boundary line $l_1$ is a region for applying anodic oxidation. The outside of the boundary line $l_1$ is entirely covered with the resist except for the anodic oxidation pad PAD.

FIG. 7 shows an example in which gate bus-lines are led out both leftward and rightward. In this case, two anodic oxidation bus-lines L are necessary. If corner portions are used for the anodic oxidation pad PAD as in this example for applying the voltage, the space can be utilized effectively. In this case, liquid level AL shows the liquid level of the anodic oxidation solution. The substrate is dipped obliquely in the solution while leaving the portion for the anodic oxidation pad PAD above the liquid level and a voltage is applied by seizing the portion by a clip or the like. If the anodic oxidation pad PAD is wetted with the anodic oxidation solution, an insulation film is formed on the surface making the oxidation impossible. The liquid surface can be adjusted extremely easily by obliquely dipping in the solution.

For the anodic oxidation method, it is immersed into the anodic oxidation solution such that the anodic oxidation pad PAD is left out of the liquid level and a DC voltage from 72V to 144V at the maximum is applied to the anodic oxidation pad PAD. For the method of application, voltage is gradually increased from 0V such that the constant current is kept at 0.5–5 mA/cm$^2$. If a high voltage is applied from the first, since a high current is supplied, the Al(Pd) wire is fused to disconnect the gate wire. A solution of 3% tataric acid adjusted with ammonia to pH 7.0±0.5 and diluted by ethylene glycol solution to 1:9 ratio is used as the anodic oxidation solution. With a current of 0.5 mA/cm$^2$, the anodic oxidation voltage reaches 144 V for about 10 min. The thickness of the $Al_2O_3$ formed then (13 in FIG. 1(d)) is 2000 Å. $Al_2O_3$ is utilized as a gate insulator and a dielectric material for the additional capacitance portion. After 144 V is attained and constant voltage oxidation is conducted, it is desirable that the state is maintained as it is from several to 10 min. This is important for obtaining a homogenous $Al_2O_3$ film.

Description will now b made returning again to FIG. 1. After removing the photoresist, TFT is formed by the following method. SiN 14 is formed to the entire surface by 2000 Å by means of a plasma CVD method. A gas comprising $SiH_4$ and $NH_3$ as the main ingredient is used for the material gas. a-Si(i) 15 is deposited to 2000 Å and a-Si(n$^+$) 16 doped with 2.5% phosphorus is deposited to 300 Å. The substrate temperature is set to 300° C., the material gas used is a gas comprising $SiH_4$ as the main ingredient for a-Si and a mixed gas of $SiH_4$ and $PH_3$ for a-Si(n$^+$). Subsequently, a-Si is patterned into an array configuration. A dry etching method using an $SF_6$ gas is used for the etching of the plasma film. As the transparent electrode for the pixel electrode, indium oxide is vapor deposited to 1000 Å by sputtering and fabricated to form a transparent electrode 17.

A signal bus-line 18 also serving as a drain electrode for TFT and Cr/Al for a source electrode are formed to a thickness of 1000 Å and 3500 Å respectively by way of sputtering and then patterned. The a-Si(n$^+$) 16 is dry etched by using the drain electrode as a mask.

Finally, after forming SiN to 1 µm as a protection film 20 and eliminating SiN on the terminal portion, the anodic oxidation bus-line L and the gate terminals $G_1$, $G_2$ are mechanically disconnected to complete a TFT substrate.

Although a dual layered film of $Al_2O_3$ and SiN is used for the gate insulator in this case, the SiN film is not always required. Further, $SiO_2$ may be used instead of the SiN film. In the TFT substrate, a voltage of about 25 V at the maximum is applied between the gate electrode and other electrode. Accordingly, at least 500 Å of film thickness is necessary for $Al_2O_3$. Further, although FIG. 1 shows a case in which each of picture elements is arranged in a row, it may be in such an arrangement as displaced by one-half pitch. In addition, manufacture can of course be made quite in the same manner also in a case where there is no additional capacitance Cad.

Further, the TFT substrate could also be manufactured by using Al, Al(Si) in addition to Al(Pd). Furthermore, the TFT substrate could also be manufactured in the same way by using Ta instead of Cr as the gate terminal.

In this embodiment, those portions not intended to be applied with anodic oxidation are covered with the photoresist but it may be also considered a method of keeping those portions not intended to be applied with anodic oxidation from in contact with the anodic oxidation solution. However, this method is not preferred having a drawback that the wirings are disconnected if the liquid surface fluctuates, even little, a great current is caused to flow to the portion coming into contact with the solution in the case of Al.

Then, a light permeable substrate having a common electrode and a color filter array of blue, red and green and the TFT substrate manufactured as described above are appended to each other by using a spacer of 7.3 µm thickness and liquid crystals are sealed therebetween to complete a liquid crystal panel. The structure will now be described below.

Figure 31:
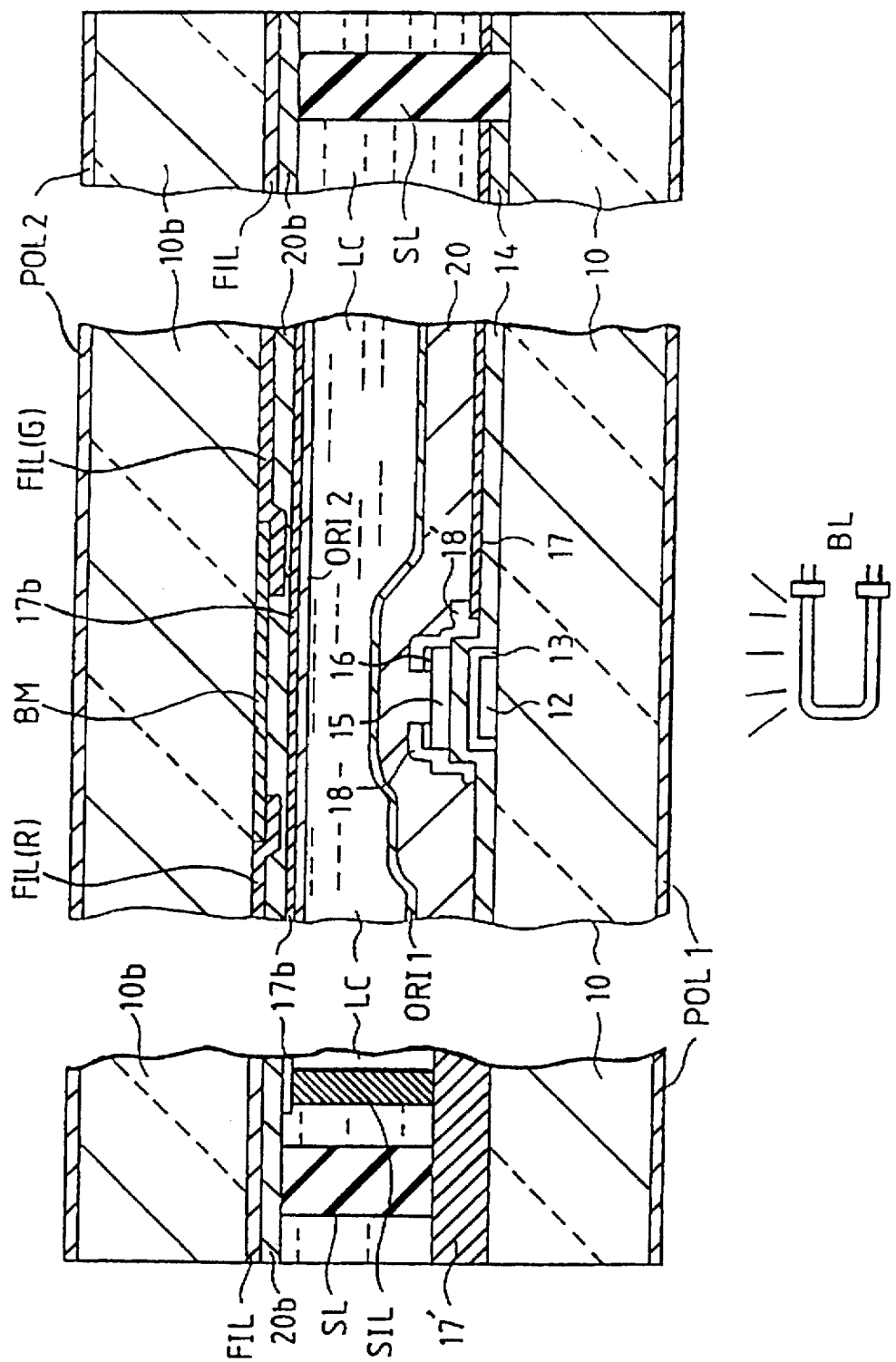
FIG. 31 is a cross sectional view of a liquid crystal display panel as one embodiment according to the present invention.
Figure 32A:
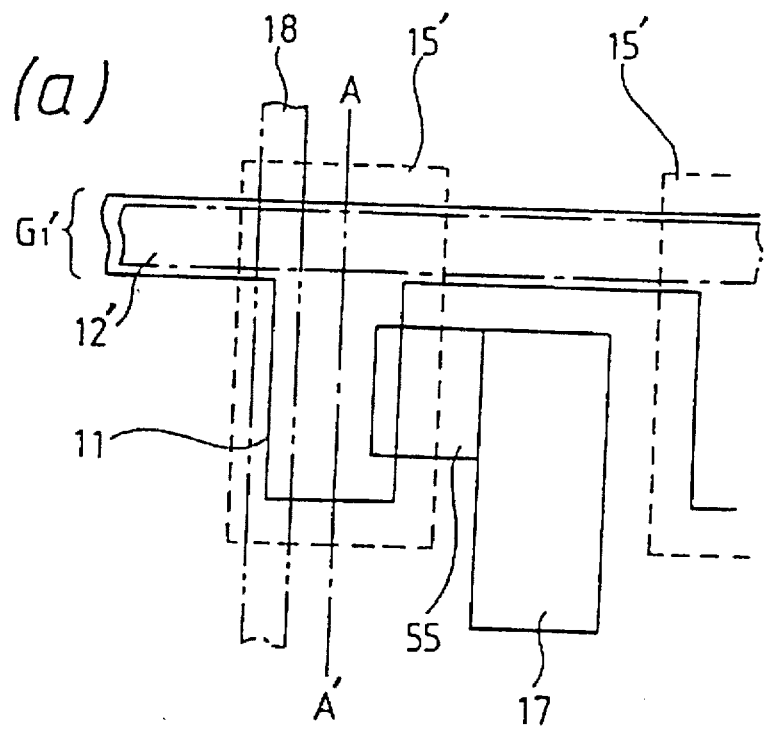
FIGS. 32(A)–32(B) are a plan view and a cross sectional view for a portion of a conventional TFT substrate and FIG. 33 is a schematic view for a liquid crystal display device of one embodiment according to the present invention.
Figure 32B:
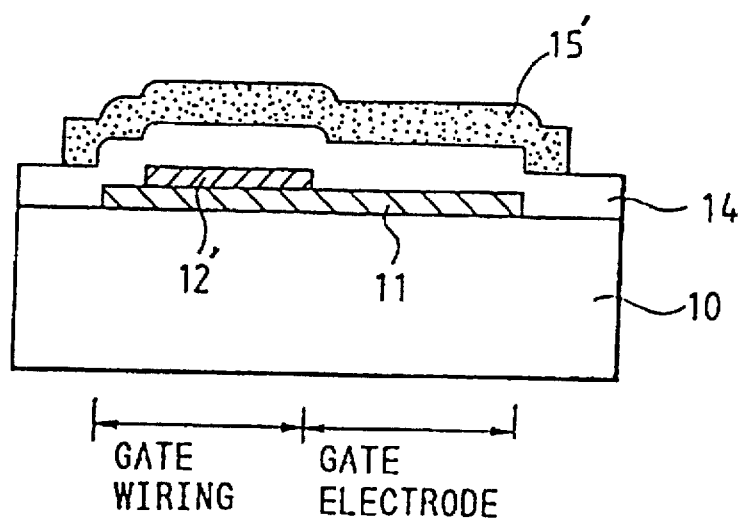

FIG. 31 shows an entire cross sectional structure of a color liquid crystals display panel. With reference to the liquid crystal LC, a TFT substrate having TFT or the like formed on a transparent glass substrate 10 is disposed below and a transparent glass substrate 10b having a color filter TFT, a light screening black matrix BM or the like formed thereon is disposed above. The thickness of the lower transparent glass substrate 10 is about 1.1 mm.

In FIG. 31, the central portion shows a cross section for one pixel portion, the left side shows a cross section of the left side ends of the transparent glass substrates 10 and 10b in which external lead wires are present, and the right side shows a cross section to the right ends of the transparent glass substrates 10 and 10b in which external lead lines are not present.

The sealing materials SL each shown on the right and left are constituted so as to seal the liquid crystal LC, and formed along the entire circumference of the transparent glass substrates 10 and 10b except for a liquid crystal sealing port (not illustrated). The sealing material SL is formed, for example, with an epoxy resin.

A common transparent pixel electrode 17b on the side of the upper transparent glass substrate 10b is connected with an external lead wire 17' formed on the side of the lower transparent glass substrate 10, at least at one portion, by means of a silver paste material SIL. The external lead wire is formed by an identical production step for each of the gate electrode, source electrode and the drain electrode.

Respective layers for orientation films ORI1 and ORI2, transparent electrode 17, common transparent pixel electrode 17b, protection films 20 and 20b, SiN 14 as insulator are formed at the inside of the sealing material SL. Polarization plates POL1 and POL2 are formed respectively to the outer surfaces of the lower transparent glass substrate 10 and the upper transparent glass substrate 10b.

Liquid crystals LC are sealed between the lower orientation film ORI1 and the upper orientation ORI2 for setting the direction of the liquid crystal molecules and sealed by the sealing portion SL.

The lower orientation film ORI1 is formed above the protection film 20 on the side of the lower transparent glass substrate 10.

To the surface on the inner side (on the side of the liquid crystal) of the upper transparent glass substrate 10b are laminated a light screening film BM, a color filter FIL, a protection film 20b, a common transparent pixel electrode 17b and an upper orientation film ORI2 successively.

EXAMPLE 2

Figure 3A:
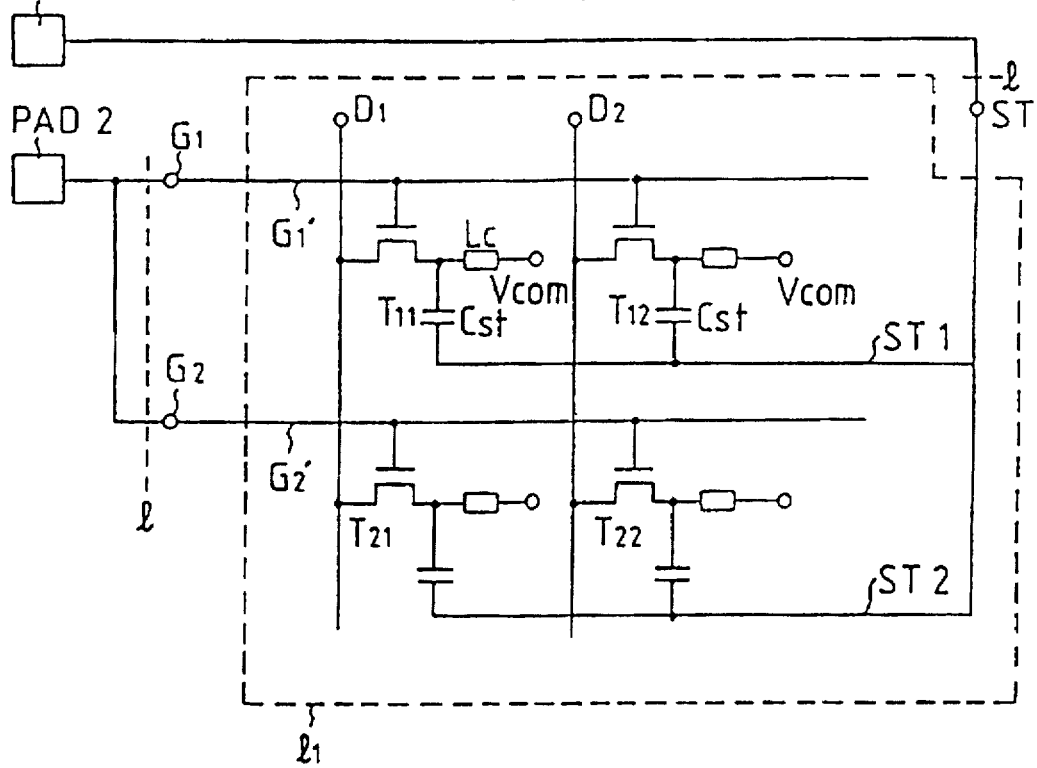
FIGS. 3(A)–3(B) are an equivalent circuit diagram and a plan view of a TFT substrate as another embodiment according to the present invention.
Figure 3B:
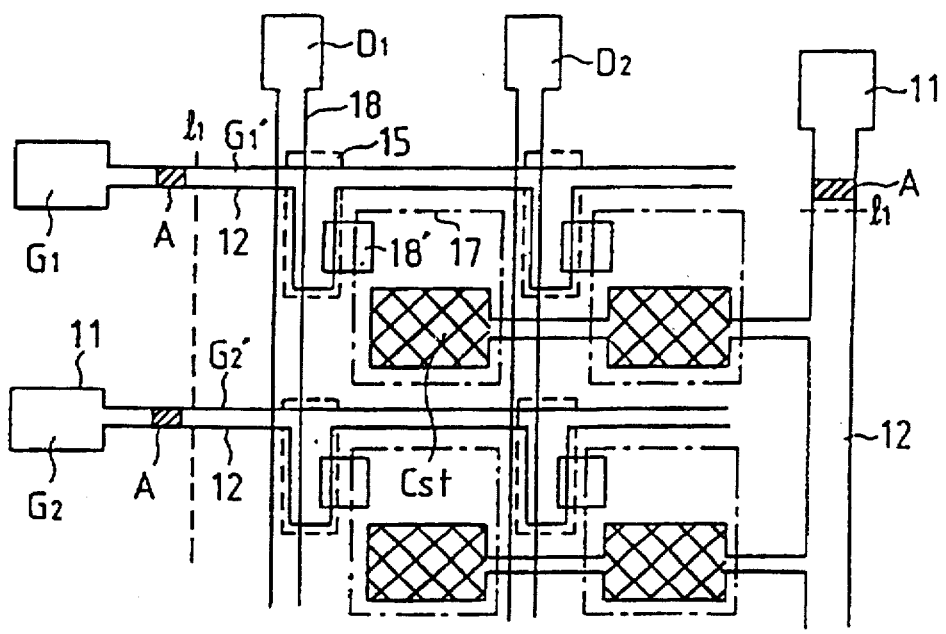

FIG. 3(a) is an equivalent circuit diagram of a TFT substrate as another embodiment according to the present invention and FIG. 3(b) is a plan view thereof. It is different from Example 1 in that the additional capacitance Cad is replaced with a storage capacitance Cst. In the additional capacitance of Example 1, the adjacent gate bus-line forms a common electrode but, in the case of the storage capacitance, common electrode bus-lines ST1, ST2 are necessary as shown in FIG. 3. As shown in FIG. 3(a), the common electrode bus-lines are connected in common and then connected with a storage capacitance terminal ST. All of reference numerals in FIG. 3 are identical with those in FIG. 1.

The manufacturing method for the TFT substrate in this embodiment is substantially identical with that in Example 1. The manufacturing method is different in that the gate bus-lines and the storage capacitance, and the common electrode bus-line are connected respectively to different anodic oxidation pads (PAD1, PAD2) and, accordingly, different anodic oxidation voltages can be applied. That is, while a relatively high voltage (about 25 V) is applied to the gate insulator as described above, only a lower voltage, that is, about 7V of voltage is applied to the storage capacitance Cst. On the other hand, since the storage capacitance Cst lowers the optical transmittance of the TFT substrate, the smaller electrode area is better. That is, thinner film thickness for $Al_2O_3$ is desirable for the storage capacitance Cst since the electrode area can be reduced. Accordingly, by making the voltage applied to the PAD1 and PAD2 different, it is possible to make $Al_2O_3$ for the gate insulator thicker (2000 Å, voltage: 144 V), while the $Al_2O_3$ for the storage capacitance Cst thinner (500 Å, voltage: 36 V).

After completing a thin film circuit quite in the same manner as in Example 1, the anodic oxidation line is removed from the TFT substrate by cutting off along the cutting line 1, to complete the TFT substrate.

Then, quite in the same procedures as those in Example 1, the TFT substrate and the light permeable substrate were appended to each other by using a spacer of 7.3 µm thickness and liquid crystals were sealed therebetween, to complete a liquid crystal display panel.

EXAMPLE 3

Figure 8A:
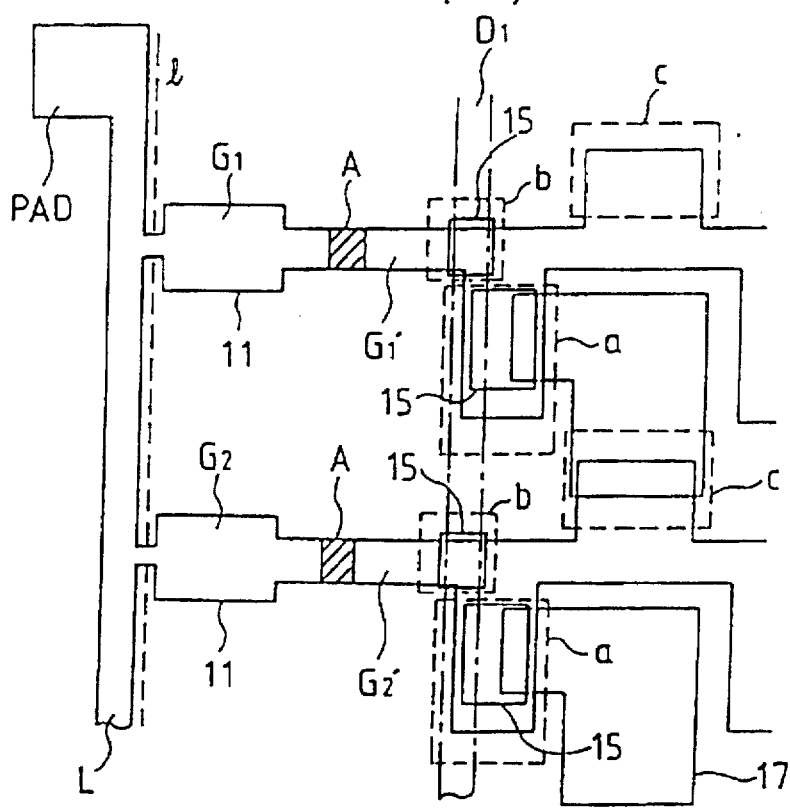
FIGS. 8(A)–8(B) are a plan view and a cross sectional view of a TFT substrate for a further embodiment according to the present invention.
Figure 8B:
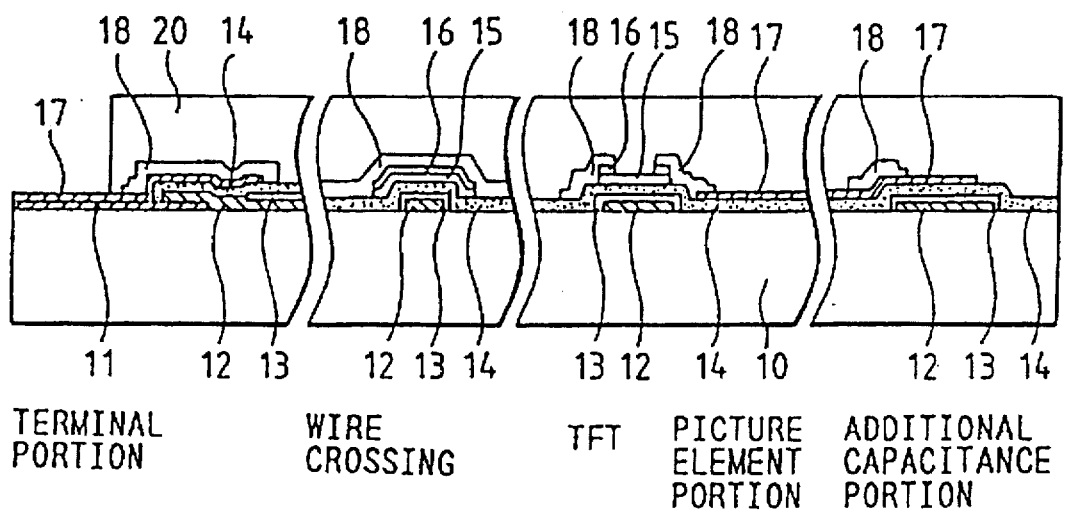

FIG. 8(a) is a plan view for a portion of a TFT substrate as a further embodiment according to the present invention, FIG. 8(b) is a cross sectional view thereof and FIG. 9 is a cross sectional view illustrating manufacturing steps thereof. In this embodiment, anodic oxidation is applied only to the portions shown by regions a, b and c (corresponding to TFT portion, bus-line intersecting portion and thin film capacitance portion respectively).

Description will now be made at first to the method of manufacturing the TFT substrate. Cr 11 is formed to a thickness of about 1100 Å on an insulative substrate 10 by means of sputtering vapor deposition, and a pattern for gate terminals G1, G2 and an anodic oxidation bus-line L connected therewith for constituting a voltage supply line for the anodic oxidation is formed by means of photoetching (FIG. 9(a)). Then, Al(Pd) (Pd addition amount of 0.1%) 12 is vapor deposited further thereover to a thickness of 2800 Å by means of sputtering and a pattern for gate bus-lines $G_1'$, $G_2'$, additional capacitance, gate electrode and anodic oxidation bus-line L made of Al(Pd) is formed by photoetching. The shape for the connection portion of the gate bus-lines $G_1'$, $G_2'$ with the gate terminals G1, G2 is identical with the shape shown in FIG. 1(c) of Example 1 (FIG. 9(b)).

Figure 9A:
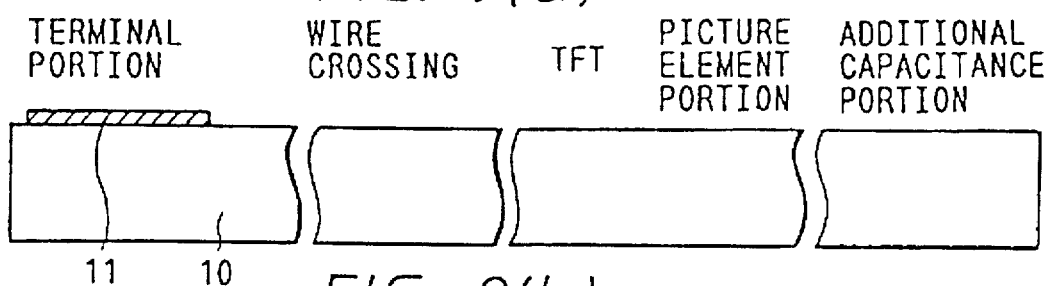
FIGS. 9(A)–9(E) are a cross sectional view illustrating manufacturing steps thereof.
Figure 9B:
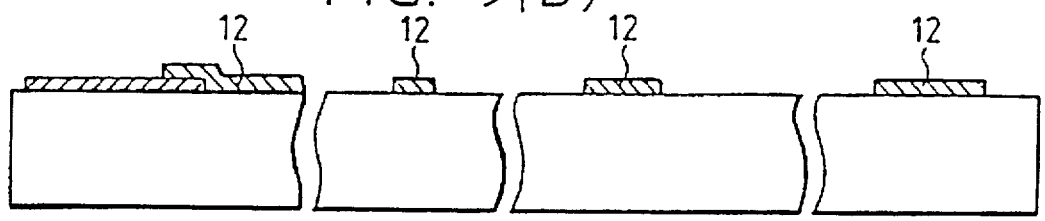
Figure 9C:
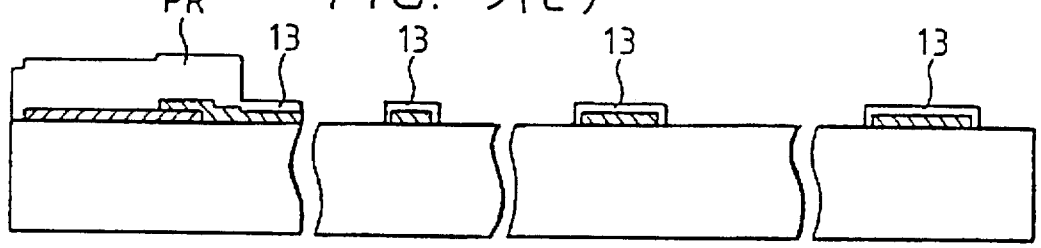
Figure 9D:
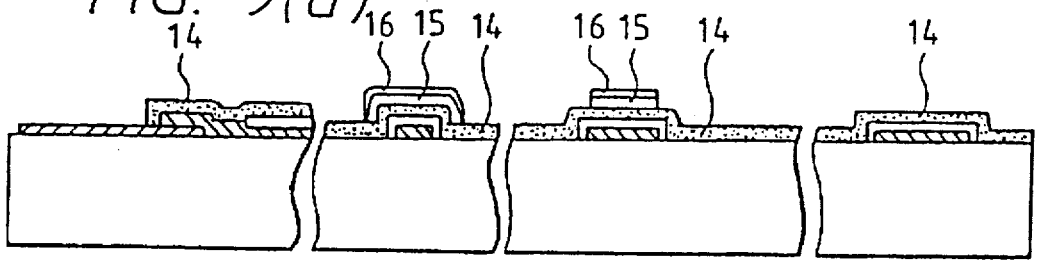
Figure 9E:
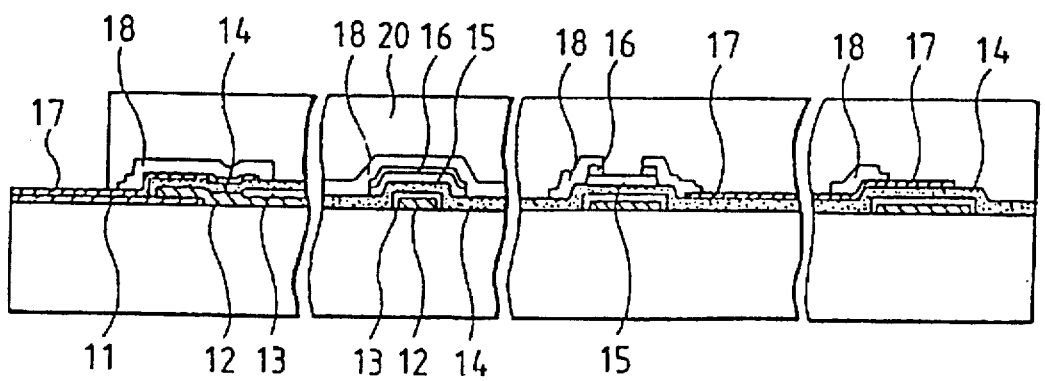

A photoresist is coated to a thickness of 3 µm, prebaked at 90° C. and then exposed. Subsequently, post baking is applied at 140° C., followed by development. Thus, photoresist for the portion to be anodically oxidized (regions a, b and c in FIG. 8) and for the anodic oxidation pad PAD is removed. FIG. 9(c) shows an example in which the photoresist PR is left only on the gate terminal portion.

In this state, the TFT substrate is dipped into an anodic oxidation solution such that the anodic oxidation pad PAD is left out of the liquid level and anodic oxidation is conducted by applying a DC voltage to the anodic oxidation pad PAD. The voltage is gradually increased from 0 V upto 145 V to the anodically oxidized Al(Pd) so as to attain 0.5 mA/cm$^2$ of current density (constant current oxidizing). When 145 V is reached, the voltage is maintained as it is (constant voltage oxidation). $Al_2O_3$ 13 of about 2000 Å thickness is obtained about 30 min after. In this case, 1300 Å out of 2800 Å for the thickness of Al(Pd) is oxidized. Since most of the gate bus-lines $G_1'$, $G_2'$ are kept from oxidation by anodically oxidizing only the regions a, b and c, the bus-line resistance can be kept low.

After removing the resist, it is heated at 200° C. for 60 min in an atmospheric air. The leak current in $Al_2O_3$ is reduced by more than one digit by the heating.

Figure 10:
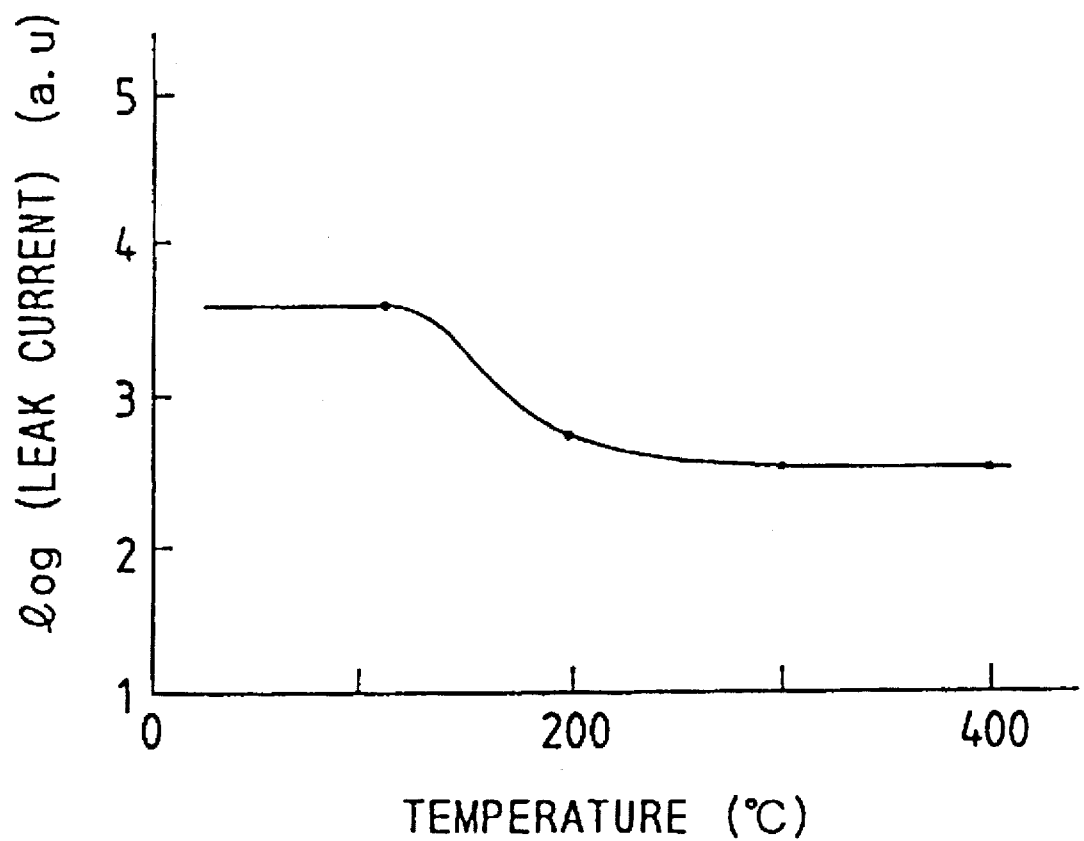
FIG. 10 is a view illustrating a relationship between a leak current and a heat treatment temperature.

FIG. 10 shows a relationship between the leak current of $Al_2O_3$ and the heat treatment temperature. The heat treatment temperature is desirably within a range from 200° C. to 350° C. At a high temperature in excess of 350° C., peeling of $Al_2O_3$ occurs. Then, there are deposited SiN 14 to a thickness of 2000 Å, a-Si(i) 15 to a thickness of 2000 Å and a-Si(n$^+$) 16 doped with 2.5% phosphorus to a thickness of 300 Å thereover by means of a plasma CVD method. In this case, the substrate temperature is set to 300° C. Subsequently, a-Si is patterned to leave a-Si in the TFT portion and the bus-line intersecting portion. Then, the SiN 14 is patterned to remove SiN on the gate terminal (FIG. 9(d)).

As a transparent electrode 17, indium oxide is vapor deposited to a thickness of 1000 Å by means of sputtering and then patterned to form the transparent electrode 17 and the gate terminal.

A signal bus-line 18 also serving as a drain electrode for TFT and Cr/Al for the source electrode are formed to a thickness of 600 Å and 4000 Å respectively by means of sputtering and then patterned. Finally, SiN is formed to 1 µm as a protection film 20, SiN on the terminal portion is removed and, subsequently, the anodic oxidation bus-line L and the gate terminals $G_1$, $G_2$ are mechanically disconnected from each other to complete a TFT substrate (FIG. 9(e)).

The thus obtained TFT substrate has a low gate bus line resistance, causes no current short circuit in the TFT portion and the bus-line intersecting portion, further, the specific dielectric constant of $Al_2O_3$ is higher by about 30% than 6.7 of SiN, the mutual conductance GM of TFT can be improved by about 1.5 times and the area of the additional capacitance portion can also be reduced, to improve the optical transmittance. In this way, a TFT substrate of high yield and high performance can be obtained.

Then, a light permeable substrate having a common electrode and color filter array of blue, red and green, and the TFT substrate prepared as described above are appended by using a spacer of 7.3 µm thickness and liquid crystals are sealed therebetween, to complete a liquid crystal display panel.

Although Al(Pd) is used as the material for the gate bus-line or pattern in this embodiment, the TFT substrate could be manufactured in the same way also by using Al, Al(Si). Further, the TFT substrate could also be manufactured in the same way by using Ta instead of Cr as the material for the gate terminal.

Although an additional capacitance is shown as an example of the thin film capacitance, the storage capacitance could be manufactured in the same manner.

Further, there is no restriction for the steps after the formation of $Al_2O_3$ and, for instance, Cr/Al signal bus-line may be prepared previously and the transparent electrode be formed subsequently. For $Al_2O_3$ formed by anodic oxidation, an example of 2000 Å thickness is shown but it is preferably from 1100 Å to 2200 Å.

An example of a-Si has been mentioned for the active layer of TFT, other material such as poly-Si may of course be used.

EXAMPLE 4

Figure 11A:
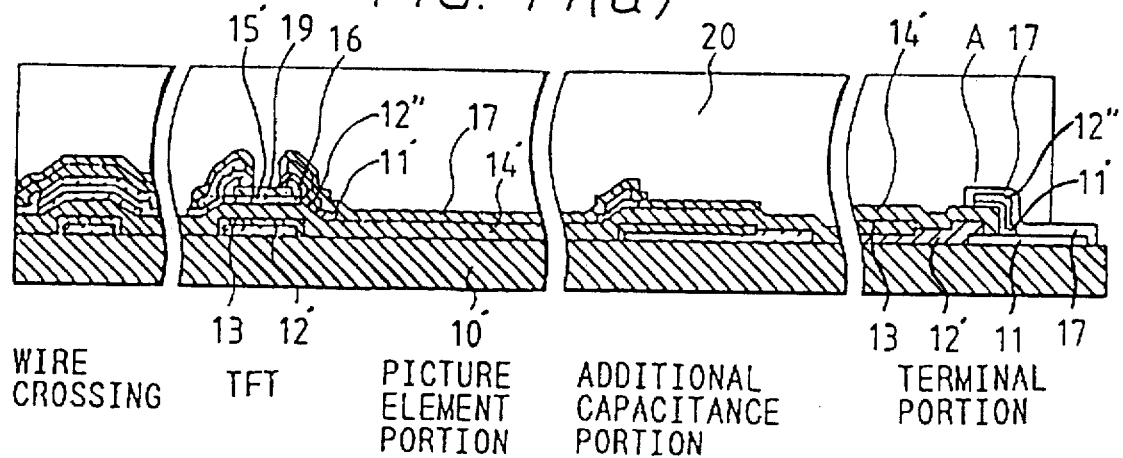
FIGS. 11(A)–11(C) are a cross sectional view, a plan view and an enlarged plan view for a portion of a TFT substrate as a further embodiment according to the present invention.
Figure 11B:
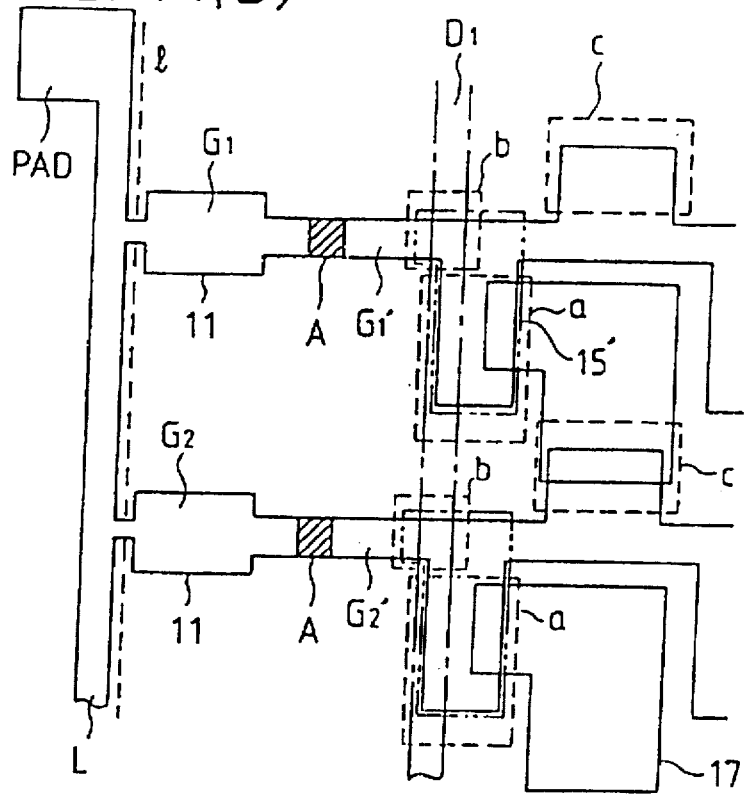

Description will now be made by using FIG. 11 (a), (b) and (c), and FIG. 12 (a), (b), (c), (d) and (e). FIG. 11(a) shows a cross section of a TFT substrate as a further embodiment according to the present invention and FIG. 11(b) shows a plan view thereof. In the figure, are shown an insulative substrate 10, Al 12 for gate bus-line pattern, Cr 11 for gate terminal, $Al_2O_3$ 13 as an anodically oxidized Al film, a silicon nitride film 14', a-Si 15', a silicon nitride film 19, phosphorus-doped hydrogenated amorphous silicon (n$^+$ layer) 16, Cr, Al, transparent electrodes 11', 12'', 17 respectively, a protection film 20, an anodic oxidation bus-line L, gate bus lines $G_1$', $G_2$', drain terminal (also serving as drain electrode of the thin film transistor) $D_1$, an anodic oxidation region a for the TFT portion, a bus-line intersecting region b and an anodic oxidized region c for the thin film capacitance portion.

FIG. 12 (a), (b), (c), (d) and (e) show cross sectional views for the respective steps. FIG. 12(a) shows after anodic oxidation, FIG. 12 (b) shows after patterning of the silicon nitride film, FIG. 12(c) shows after patterning of n$^+$ layer, FIG. 12(d) shows after patterning Al 12'' and FIG. 12(e) shows after patterning the transparent electrode 17 for pixel electrode.

Cr is formed to a thickness of 1100 Å by sputtering vapor deposition on an insulative substrate 10 and then patterned to form gate terminals $G_1$, $G_2$ and an anodic oxidation bus-line for connecting them in common and forming a voltage supply line for anodic oxidation. Further, Al is formed by a sputtering method to a thickness of 2600 Å and then patterned to form a gate electrode 12' and gate bus-lines $G_1$', $G_2$'. In this case, each of the gate bus-lines $G_1$', $G_2$' is connected in common by means of the anodic oxidation bus-line L. Subsequently, a photoresist is coated to 3 µm and the resist is removed from regions a, b and c surrounded with broken lines shown in FIG. 11(b) by a photoetching method.

In this state, the substrate is dipped into an anodic oxidation solution and a voltage is supplied to the anodic oxidation bus-line. The voltage is gradually increased from 0 to +120 V to Al to be anodically oxidized so as to attain 0.5–10 mA/cm$^2$ of current density (constant current oxidation). When +120V is reached, the voltage is maintained as it is (constant voltage oxidation). About 30 min after, $Al_2O_3$ 13 of about 1700 Å is obtained. In this case, 1100 Å out of 2600 Å for the thickness of Al is oxidized. As the anodic oxidation solution, a solution prepared by neutralizing a 3% tartaric acid solution with ammonia and then by diluting with ethylene glycol or proplylene glycol to 1.9 and adjusting to pH to 7±0.5 is used Since most of Al for the gate bus-lines $G_1$', $G_2$' can be kept from anodic oxidation by such a local anodic oxidation, the bus-line resistance can be kept low.

Figure 11C:
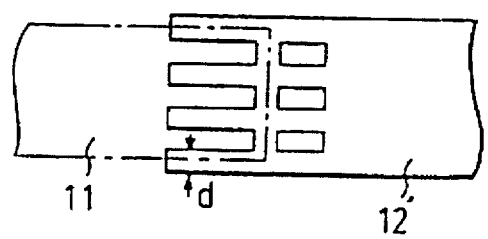

FIG. 11(c) shows an enlarged view for a connection region A between the Al 12' for the gate bus-line and the Cr 11 for the gate terminal. In the figure, d represents a line-width for the Al pattern. Such a complicate pattern is used in order to avoid the occurrence of whisker when thermal stresses are applied to Al or a metal mainly composed of Al. If the line width d of Al is more then 25 µm, whisker may sometime be formed but whisker is not formed if the line with d is less than 20 µm, preferably, less than 10 µm. The pattern as shown in FIG. 11(c) was taken in view of the above. Apparently, whisker does not occur at the portion of Al covered with $Al_2O_3$. After removing the resist, it is heated in an atmospheric air or vacuum at 200°–400° C. for 60 min. This heating decreases the leak current of $Al_2O_3$ by more than one digit. This is shown in FIG. 10. For the heat treatment temperature, 200° to 400° C. is preferred. At a higher temperature, peeling occurs on the Al film. Then, there are deposited a first silicon nitride 14' to a thickness of 1200 to 2000 Å, a-Si 15' to a thickness of 200 to 1000 Å and a second silicon nitride 19 to a thickness of 1000 to 2000 Å thereover by means of a plasma CVD method. In this case, the substrate temperature is set to 150° to 300° C. Subsequently, the second silicon nitride 19 is patterned and left only on the channel of the TFT and the bus-line intersecting portion (FIG. 11(a)).

An amorphous silicon (n)$^+$ layer 16 doped with 0.6 to 2.5% phosphorous is deposited to a thickness of 200 to 500 Å and then patterned to be left only on the source-drained portion of TFT. In this case, the a-Si 15' is removed at the same time. The Cr 11' is deposited to a thickness of 500 to 1000 Å and the Al 12'' is deposited to a thickness of 3000 to 8000 Å by means of ohmic heating vapor deposition or sputtering and then patterned to form the drain terminal $D_1$, and the drain-source electrode of TFT. Then, a transparent electrode 17 made of indium oxide is deposited to about 1000 Å by means of sputtering and then patterned to form pixel electrode, terminal and the like. Then, silicon nitride is deposited to about 1 µm by means of plasma CVD and silicon nitride on the terminal portion is removed by means of a photoetching process to complete a thin film transistor substrate.

The substrate and the counter substrate are appended, liquid crystals are sealed therebetween and, finally, the gate bus-line L is cut out along the cutting line shown in FIG. 11(b) to separate each of the gate terminals to complete a display panel. The gate bus-line L also serves for protecting the panel from electrostatic breakdown.

The thus obtained display panel has a low gate bus-line resistance, causes no interelectrode short-circuit in the bus-line intersecting portion, the specific dielectric constant of $Al_2O_3$ is 9.2 which is higher by about 30% than 6.7 for silicon nitride, mutual conductance gm of TFT can be improved by 1.5 times, and the area of the additional capacitance portion can be reduced to improve the optical transmittance. Thus, a panel can be obtained at high yield and high performance. An example of using Al for the gate electrode, bus-line is shown, but Al containing less than 1% of Si or Pd can be used quite in the same way instead of Al. Further, although Al has been used for the drain terminal, previously described Al(Si), Al(Pd) can also be used instead of Al.

Figure 13A:
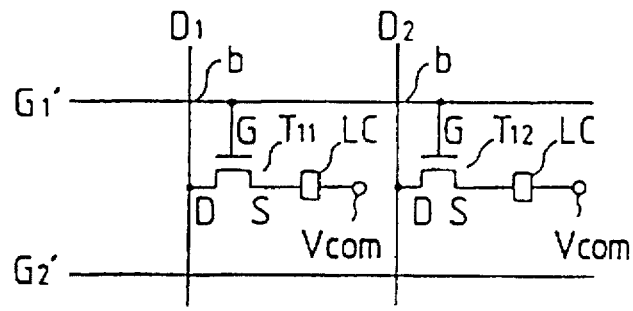
FIGS. 13(A)–13(D) are equivalent circuit diagrams for a portion of a TFT substrate of embodiment according to the present invention.

Description will now be made to a thin film capacitance. FIG. 13(a), (b), (d) and (d) shows a circuit diagram for a portion corresponding two pixels of the TFT substrate.

Figure 13B:
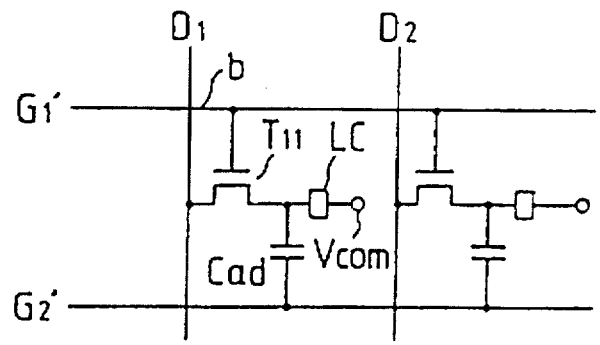
Figure 13C:
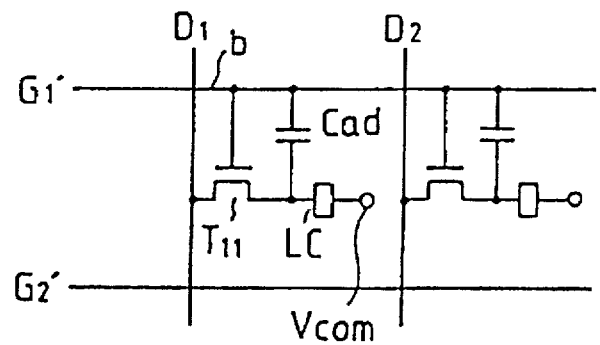
Figure 13D:
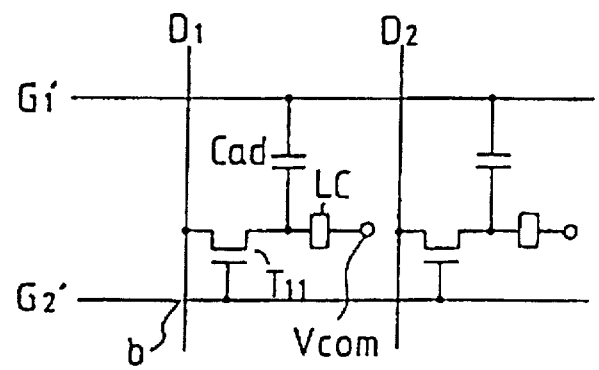

FIG. 13(a) shows a case with no additional capacitance, FIG. 13(b) shows a case in which an additional capacitance is formed between adjacent gate but-lines FIG. 13(c) shows a case in which an additional capacitance is formed with respect to the gate bus-line of its own and FIG. 13(d) shows an another case in which the additional capacitance is formed with respect to the adjacent gate bus-line.

In the figure, there are depicted a gate bus-line $G_1'$, an adjacent gate wiring $G_2'$, a TFT $T_{11}$, $T_{22}$, a liquid crystal LC, gate, source and drain G, S and D of HT respectively, a common terminal $V_{com}$, a bus-line intersecting region b, an additional capacitance $C_{ad}$, and drain terminals $D_1$, $D_2$. In FIG. 13(b), (d), $G_2'$ may of course be formed as a bus-line separate from the gate bus-line.

Any of the cases can of course be manufactured quite in the same way. Further, an example in which the gate electrode D and the bus-line intersecting region d are separated is shown here but they may not be separated from each other.

Figure 14A:
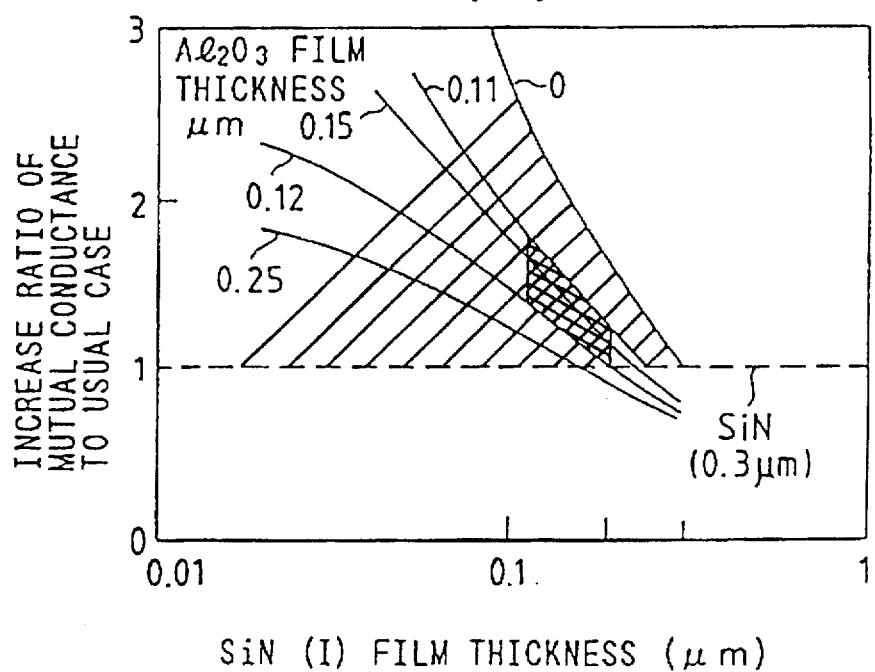
FIGS. 14(A)–14(B) are a view illustrating a relationship between the mutual conductance and the thickness of the insulation film and a view showing leak characteristics of the anodic oxidized film.
Figure 14B:
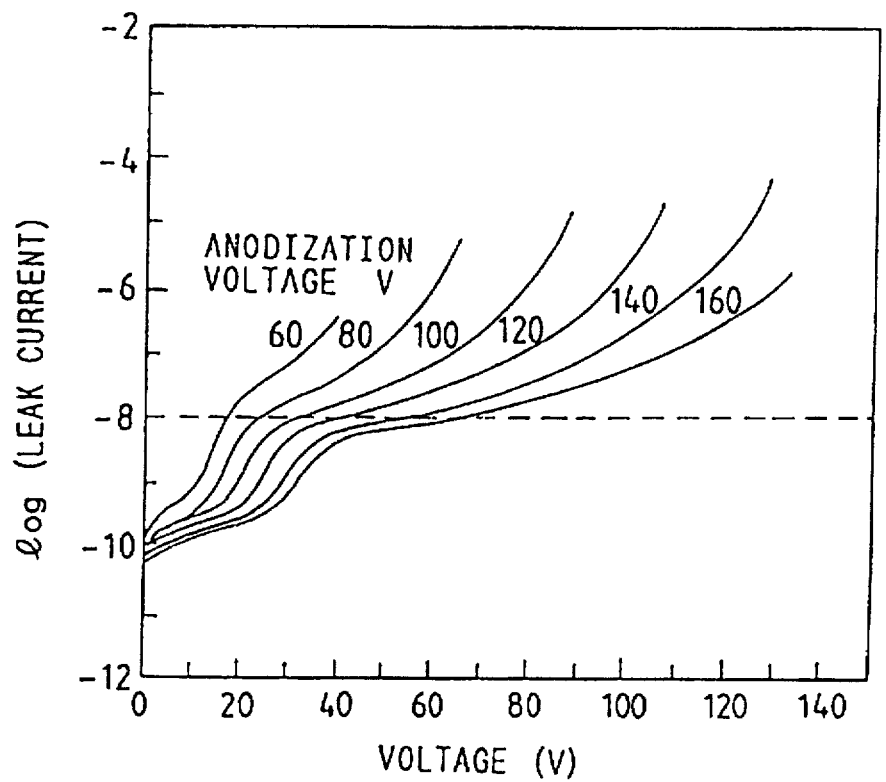

Most important feature is a thickness of the $Al_2O_3$ film and description will be made thereto. Referring to the mutual conductance gm of TFT, a thinner gate insulator is better. FIG. 14(a) shows a relationship between the mutual conductance gm and the film thickness of $Al_2O_3$, SiN. Heretofore, SiN of about 0.3 μm thickness has often been used as the gate insulator. The value for the mutual conductance gm when the film thickness of $Al_2O_3$ and SiN is changed is shown assuming the mutual conductance gm as 1 in the aforementioned conventional case. As apparent from the figure, the merit of using the dual layered gate insulator resides in that the mutual conductance gm can be improved in addition to the interelectrode short circuit. Accordingly, a region applied with hatching in FIG. 14(a) is a most desirable region in view of the mutual conductance gm. On the other hand, as the thickness is reduced, the breakdown voltage is lowered. In the operation state of a conventional liquid crystal panel, a voltage of 25V at the maximum is applied between the gate and the drain (signal bus-line) (with the gate as negative polarity). In actual products, for compensating the voltage of 25 V, screening is applied at 75V, that is, three times thereof. Accordingly, each of the films of $Al_2O_3$ and SiN should have a film thickness capable of withstanding the voltage (on the premise of the presence of obstacles, it has be considered that there are a portion with no $Al_2O_3$ and a portion with no SiN). Table 2 shows the withstand voltage at break and the minimum film thickness capable of withstanding 75V of the $Al_2O_3$ and Sin films. It is necessary for $Al_2O_3$ and SiN that each of them has more than 1100 and 1200 Å respectively. The thickness of 1100 Å for $Al_2O_3$ corresponds to the anodic oxidation voltage at 80V.

TABLE 2

| Insulator | Withstand voltage at break MV/cm | Film thickness withstanding 75 V (Å) | Anodic oxidation voltage (V) |
|---|---|---|---|
| $Al_2O_3$ | 6.8 | 1100 | 80 |
| SiN | 6.3 | 1200 | " |

Further, FIG. 14(d) shows a leak current characteristic of the anodic oxidized film $Al_2O_3$. The leak current is low upto a certain voltage but increases abruptly exceeding that voltage. The current is added to the off current of TFT. Accordingly, it is desirably as low as possible. Since the off current of TFT is about $10^{-8}$ A/cm², it is necessary that the leak current is also lower than that. As has been described above, while a voltage at −25V is applied to a liquid crystal panel, the leak current is reduced to less than $10^{-8}$ A/cm² at that voltage when the anodic oxidation voltage is higher than 80 V. It can be said also in this point that the $Al_2O_3$ requires a film thickness of greater than 1100 Å.

As a limit for the $Al_2O_3$ film thickness, there is mentioned the withstand voltage of the resist. Although the portion not intended to apply anodic oxidation is covered with the photoresist as described above, if the anodic oxidation voltage exceeds the withstand voltage of the photoresist, the resist is destroyed and, at the same time, Al present thereebeneath is lost. Accordingly, it is not appropriate to increase the anodic oxidation voltage and it is desirably lower than 150V (film thickness of $Al_2O_3$ is about 2100 to 2200 Å in this case). FIG. 14(a) shows the optimum region for the film thickness of $Al_2O_3$ and SiN described above by a lattice-like mesh.

A dual-layered insulation film is desired within a range from 1100 to 2200 Å, in particular, within a range from 1100 to 2100 Å for $Al_2O_3$ and within a range from 1200 to 2000 Å for siN.

EXAMPLE 5

Figure 15A:
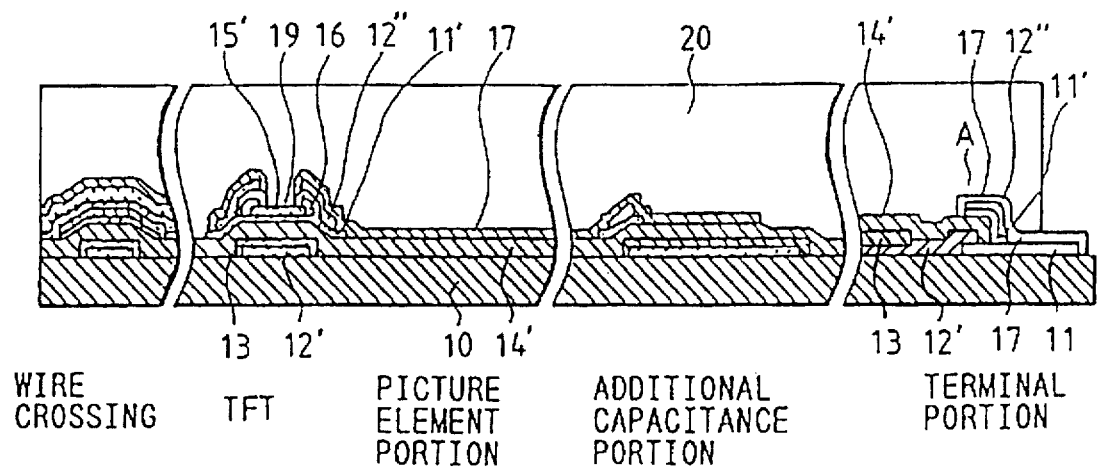
FIGS. 15(A)–15(C) are a cross sectional view, a plan view and an enlarged plan view for a portion of a TFT substrate as a further embodiment according to the present invention.
Figure 15B:
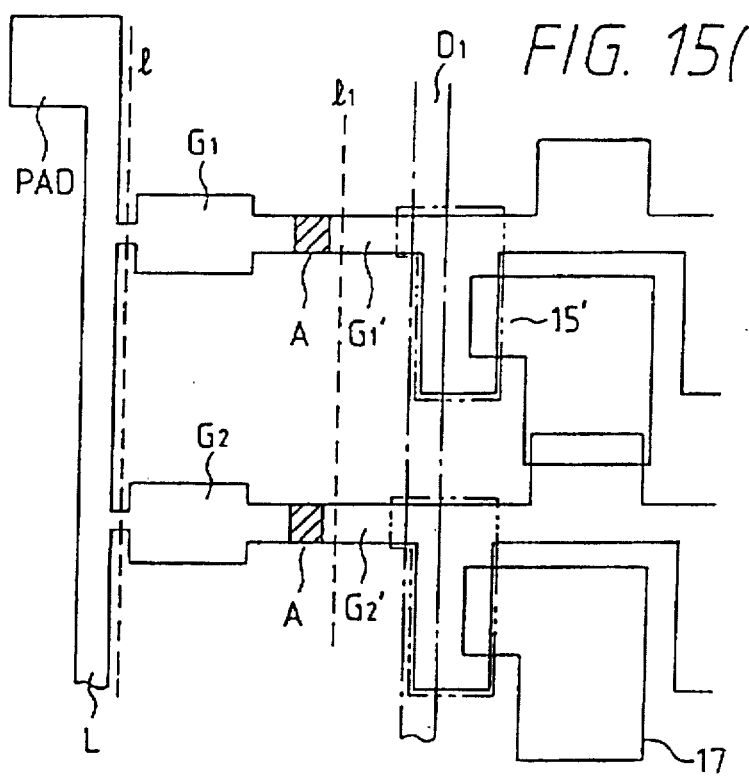
Figure 15C:
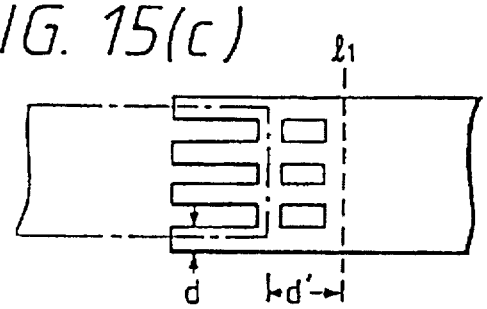

This example shows a case of entirely applying anodic oxidation except for the gate terminal portion. FIG. 15(a) shows a cross section for a TFT substrate according to this example, FIG. 15(b) shows a plan view thereof and FIG. 15(c) shows an enlarged view for the connection portion between the gate terminal and the gate bus-line or wiring.

The manufacturing step is the same as in Example 4. Only the shape of the photoresist upon anodic oxidation is different. After covering the area on side of the gate terminal from the line shown by a broken line $l_1$ in FIG. 15(b), anodic oxidation is applied. If a Cr gate terminal is in contact with an anodic oxidation solution, Cr in that portion is leached out by a cell reaction and, accordingly, it has to be covered completely with the resist. The reference d' in FIG. 15(c) shows a distance between the resist end and Cr and d' has to be greater than 100 μm since the anodic oxidation solution permeates. In this case, the end face of the resist is in perpendicular to the gate bus-line. Description has been made to the withstand voltage of the resist in Example 4, and the withstand voltage of the resist greatly depends on a relative positional relationship between the resist pattern and the Al bus-line pattern. This will now be explained.

Figure 16:
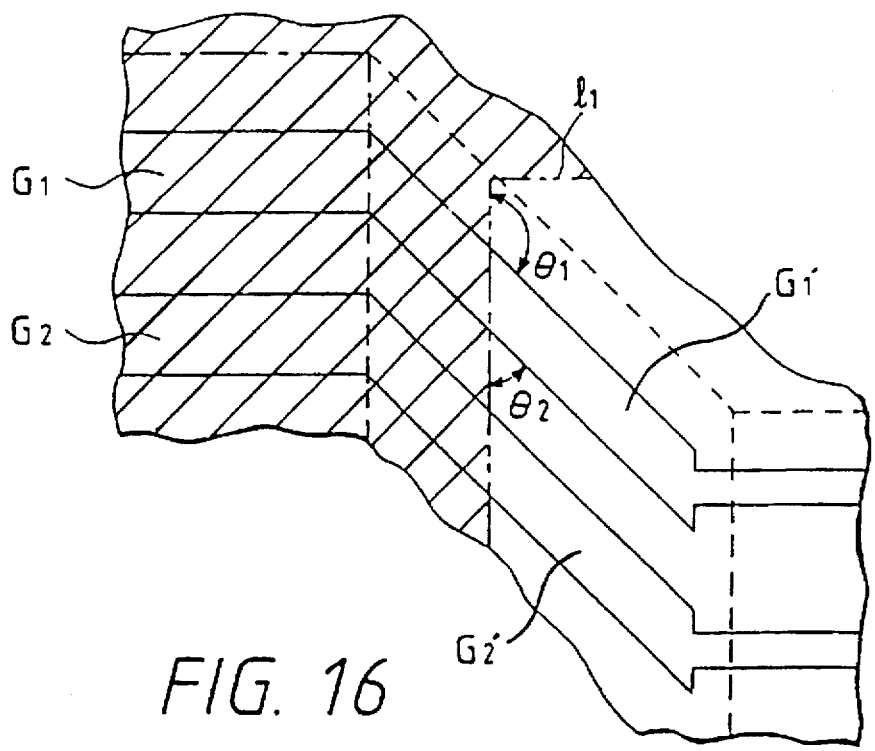
FIG. 16 and FIG. 17 are plan views illustrating the state of intersection between gate bus-lines and photoresist ends.

As shown in FIG. 16, the gate terminal has an oblique portion near the top end thereof. When such a portion is coated with the photoresist, a photoresist pattern as shown in FIG. 16 (hatched portion is to be covered with the photoresist) may be considered. In this case, each of the gate bus-line and the resist end intersects with an angle $\theta_1$, $\theta_2$ as shown in the figure. In this case, as shown in the figure, $\theta_1$ is an obtuse angle and $\theta_2$ is an acute angle. When anodic oxidation is applied with such a resist pattern, gate bus line is leached out on the side of the acute angle $\theta_2$ to disconnect the gate bus-line. This is caused by the scattering of the light due to the gate bus-line upon exposure of the resist pattern since the gate bus-line situates near the resist end and, as a result, the thickness of the resist film is reduced to deteriorate the withstand voltage in this portion.

Figure 17:
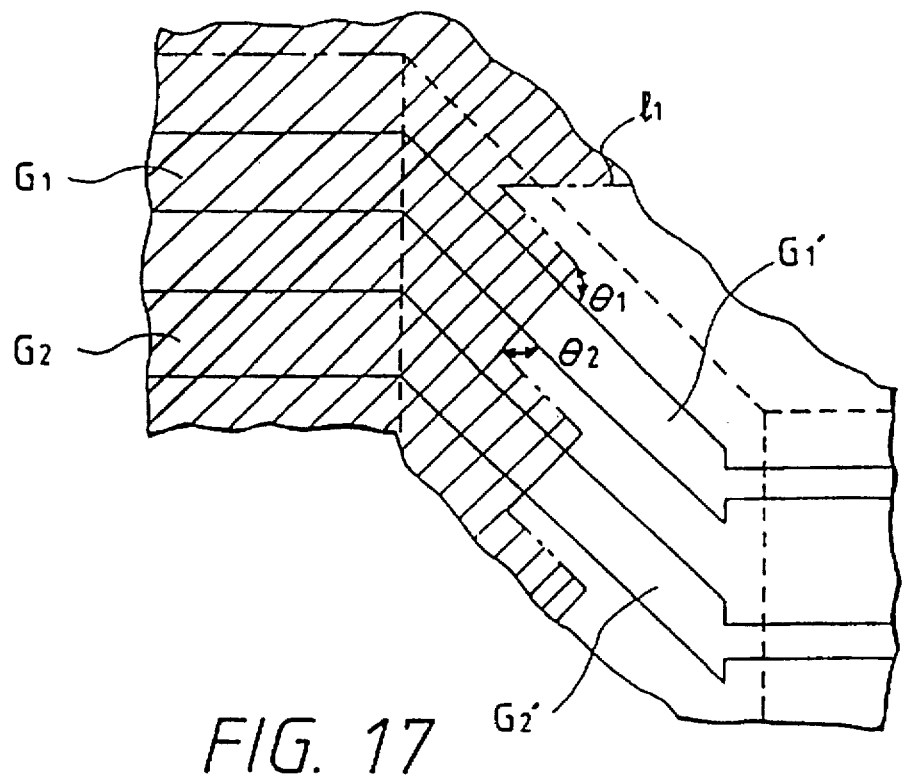

This can be prevented by making $\theta_1$, $\theta_2$ of the resist pattern as a normal angle or an obtuse angle. FIG. 17 shows a case in which each of $\theta_1$ and $\theta_2$ is formed as a normal angle.

Although descriptions have been made in Examples 4 and 5 to a case of forming a silicon nitride film on $Al_2O_3$, $SiO_2$ may also be used instead of silicon nitride in Examples 4 and 5.

$SiO_2$ is formed by the following method. An $SiO_2$ film is formed to a film thickness of 1000 to 3000 Å by using a gas mixture comprising $SiH_4$ and $N_2O$ as the main ingredient by means of a plasma CVD method. The substrate temperature is set to 200° to 300° C. The structure in the case of using the $SiO_2$ film is different only in that the silicon nitride 14' in FIGS. 11 and 12 is changed to $SiO_2$. Others are quite identical with those in Examples 4 and 5.

EXAMPLE 6

Figures 18A, 18B, 18C:
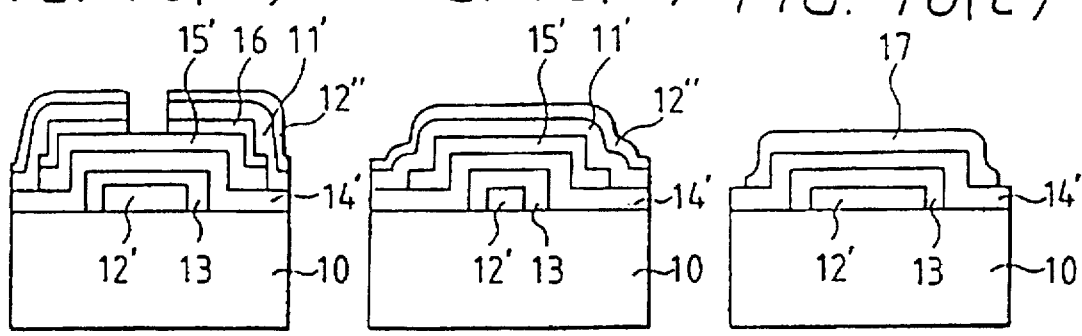

In Examples 4 and 5, first silicon nitride, amorphous silicon and second silicon nitride were deposited in this order on $Al_2O_3$ by means of a plasma CVD method, but this example shows a case of not using second silicon nitride. Explanation will be made referring to FIG. 18(a), (b), (c), (d), (e) and (f). FIG. 18(a), (b) and (c) show cross sectional views taken along lines a–a', b–b' and c–c' for the portions corresponding to a TFT portion (region a), a bus-line intersecting portion (region b) and an additional capacitance portion (region c) show in the figure (c). References in the figures are identical with those in the previous examples. A plane layout is identical with that in FIG. 11(b).

Al 12' is formed to 2800 Å on an insulative substrate 10. Then, it is patterned to form a gate bus-line pattern including the gate wiring or bus-line $G_1'$, the gate electrode and the additional capacitance electrode. $Al_2O_3$ 13 is formed by anodic oxidation. The anodic oxidation voltage is set to 144V. In this case, the film thickness of $Al_2O_3$ 13 is about 2000 Å and the film thickness of the not anodically oxidized Al 12' is about 1500 Å. Silicon nitride 14' (which may be silicon oxide) is formed thereover to a thickness of 1200 to 2000 Å by means of a plasma CVD method. Successively, amorphous silicon 15' is formed to 200 to 2000 Å. Further, amorphous silicon 16 containing 0.5 to 2.5% of phosphorus is deposited. Subsequently, an amorphous silicon film in the portion other than the TFT portion and the bus-line intersecting portion is removed by a photoetching process. Then, Cr 11' is formed to a thickness of 400 to 1000 Å and Al 12' is formed to a thickness of 3000 to 5000 Å, which are patterned to form a signal bus-line and a source, drain electrode of TFT. Then, a phosphorus-doped amorphous silicon 16 is fabricated by using them as a mask. Subsequently, an indium oxide transparent electrode 17 is formed to a thickness of 500 to 2000 Å by means of a sputtering method to form a pixel electrode. The transparent electrode may be left on the entire area of Al. Thus, a TFT substrate having the structure as shown in FIG. 18(a)–(c) is completed. A silicon nitride protection film (about 1 μm) is formed thereover and, subsequently, a panel is completed in the same procedures as in the previously described examples.

Figures 18D, 18E:
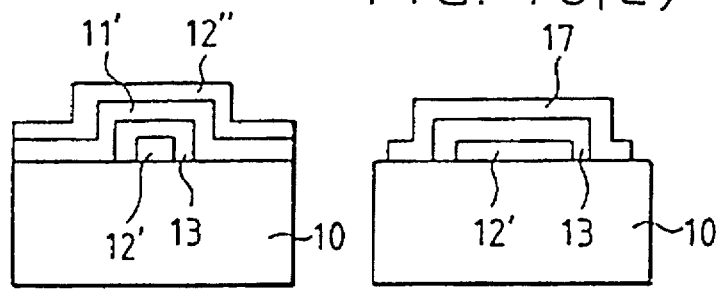
Figure 18F:
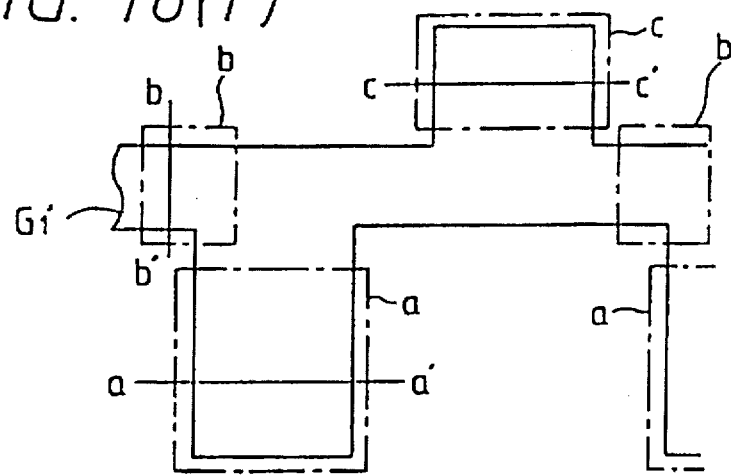

The bus-line intersecting portion and the additional capacitance portion may take a structure not only that as described above but also a structure, for example, as shown in FIG. 18(d) and (e).

FIG. 18(d) shows an example in which the interlayer insulation film in the bus-line intersecting portion consists only of $Al_2O_3$ and FIG. 18(e) shows a case in which the dielectric material of the additional capacitance portion consists only of $Al_2O_3$. In this way, it is of course possible to select only $Al_2O_3$, SiN, $SiO_2$ or a-Si to be sandwiched by changing the mask.

This example has a feature that the amorphous silicon and phosphorus-doped amorphous silicon films can be formed continuously and the characteristic of the thin film transistor can be stabilized.

In addition, similar effect can also be attained by using Al (1% Si) or Al (0.3% Pd) instead of Al. Furthermore, although a dual-layered film of Cr and Al is used herein for the drain terminal, it may consist only of Al.

EXAMPLE 7

FIG. 19(a), (b), (c), (d) and (e) shows an example, one example of the equivalent circuit of which is shown in FIG. 13(b). FIG. 19(b), (c), (d) and (e) show cross sectional views for the portions corresponding to lines A–A', B–B', C–C' and D–D' respectively shown in the FIG. 19(a).

Al(0.1% Pd) 12 is formed to a thickness of 2800 Å on an insulative substrate 10 and patterned by photoetching to form a gate electrode 56, a gate bus-line $G_1'$, a storage capacitance line 51 and a storage capacitance Cst. Al(Pd) is anodically oxidized by the method described in Examples 4, 5 to form $Al_2O_3$ to a thickness of 2000 Å by the methods described in Examples 4, 5. Silicon nitride 14' is formed thereover to a thickness of 1200 to 2000 Å by means of a plasma CVD method and, further, amorphous silicon 15' is formed to a thickness of 200 to 2000 Å. Further, a phosphorus-containing amorphous silicon 16 is formed. Subsequently, amorphous silicon in the portion other than the TFT portion and the bus-line intersecting portion is removed. Further, the silicon nitride film on the storage capacitance Cst is removed. Thus, only $Al_2O_3$ remains on the storage capacitance. The silicone nitride film is usually removed by a plasma asher using a $UF_4$ gas. Since the $Al_2O_3$ film is highly resistant to the $CF_4$ gas asher, is it possible to remove only SiN on $Al_2O_3$. Subsequently, Cr is formed to a thickness of 400 to 1000 Å and Al is formed to a thickness of 3000 to 5000 Å and then patterned to form a signal bus-line 18, a source electrode 55 for TFT and wiring or bus-line 57 for storage capacitance. Then, phosphorus doped amorphous silicon 16 is fabricated by using them as a mask. Subsequently, a transparent electrode 17 made of indium oxide is formed to a thickness of 500 to 2000 Å by means of a sputtering method to form a pixel electrode. The transparent electrode may left on the entire surface of Al. A silicon nitride film is formed thereover as a protection film 20 and, subsequently, a TFT substrate is completed in the same way as in the previously described examples.

In this example, only $Al_2O_3$ is used as the insulation film for the storage capacitance portion. Although an insulation film comprising a dual layer of $Al_2O_3$/SiN may also be used additionally, since the film consisting only of $Al_2O_3$ can provide greater capacitance and reduce the occupying area of the storage capacitance portion by so much, optical transmittance of the substrate can be improved. Insulation film (dielectric film) usable in this example and portions requiring it are set force in Table 3.

TABLE 3

| | Material | | |
| --- | --- | --- | --- |
| Position | Oxide film | Silicon nitride film | a-Si film |
| Gate portion | ○ | ○ | ○ |
| Interjection | ○ | ○ | Δ |

TABLE 3-continued

| Position | Material | | |
|---|---|---|---|
| | Oxide film | Silicon nitride film | a-Si film |
| between gate bus-line and signal bus-line Intersection between storage capacitance sire and signal bus-line | ○ | ○ | Δ |
| Storage capacitance portion | ○ | x | x |

○: necessary, x: not necessary, Δ: usable in both cases
Use or not use may be determined depending on the case for the case of symbol in the table.

EXAMPLE 8

The storage capacitance line 51 was disposed separately from the gate bus-line $G_1'$ in Example 7 but, in this example, a portion of an adjacent gate bus-line $G_2'$ is used as the storage capacitance as shown in FIG. 20(a), (b), (c), (d) and (e). FIG. 20(b), (c), (d) and (e) show the cross sectional views for the portions corresponding to lines A–A', B–B', C–C' and D–D' shown in FIG. 20(a) respectively.

EXAMPLE 9

Figure 21:
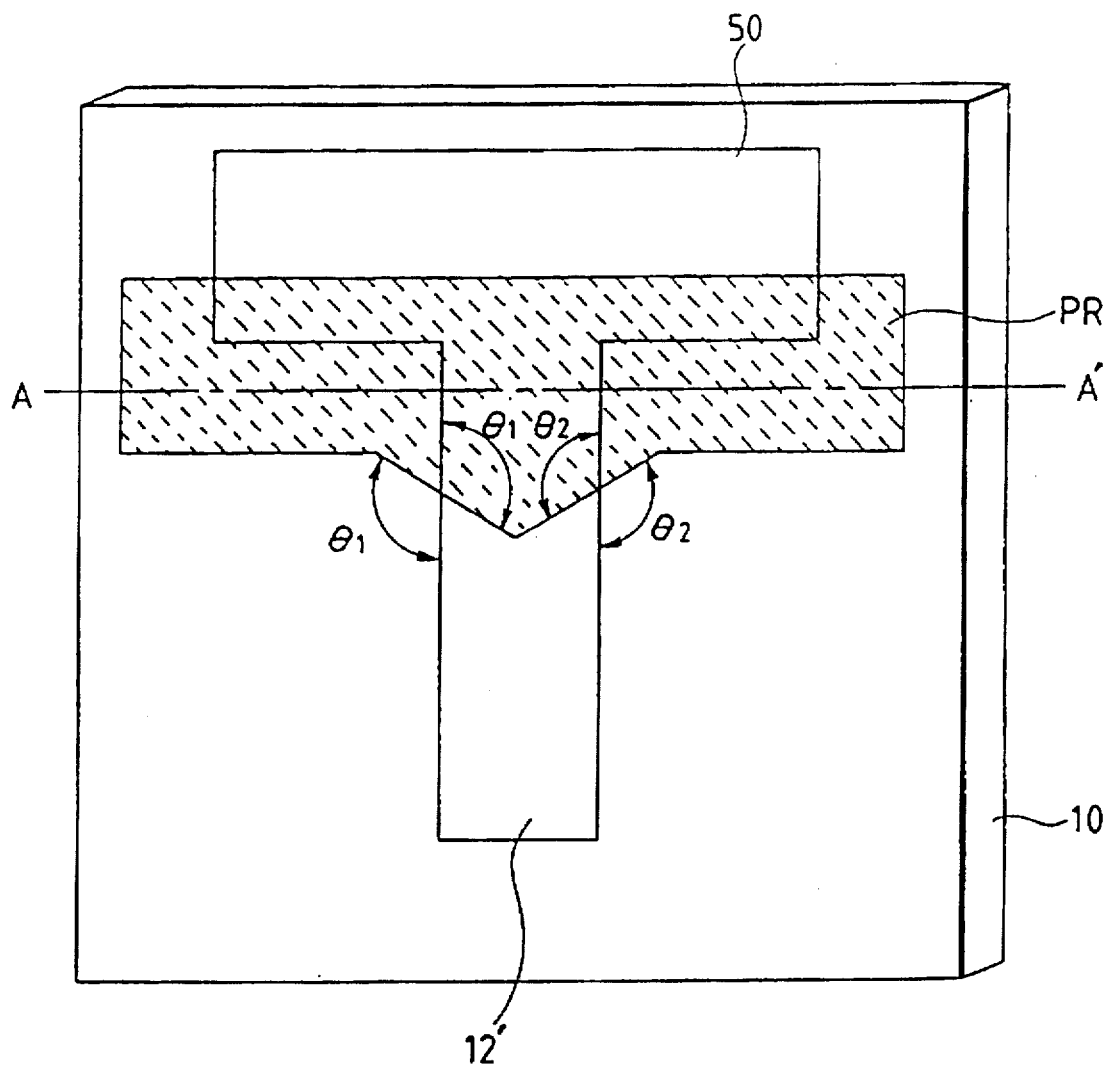
FIG. 21 is a plan view illustrating the state of intersection between an Al pattern and a photoresist end.
Figure 22:
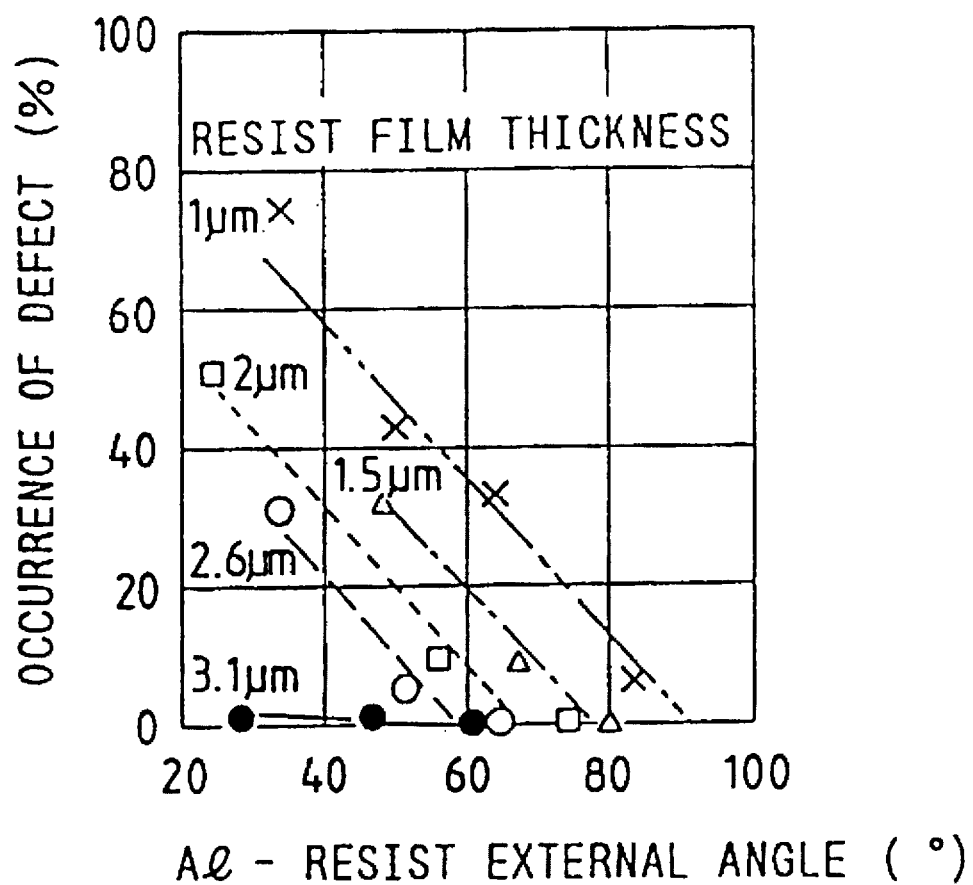
FIG. 22 and FIG. 23 are views illustrating the effect of the angle in the intersection.
Figure 23:
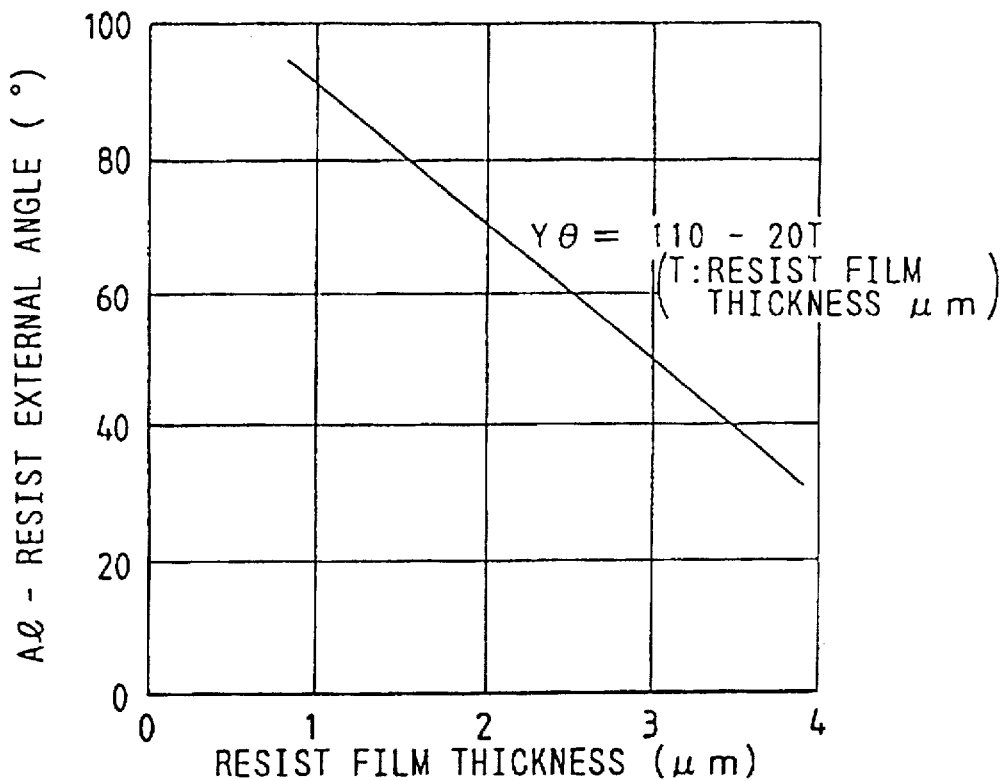
Figure 24:
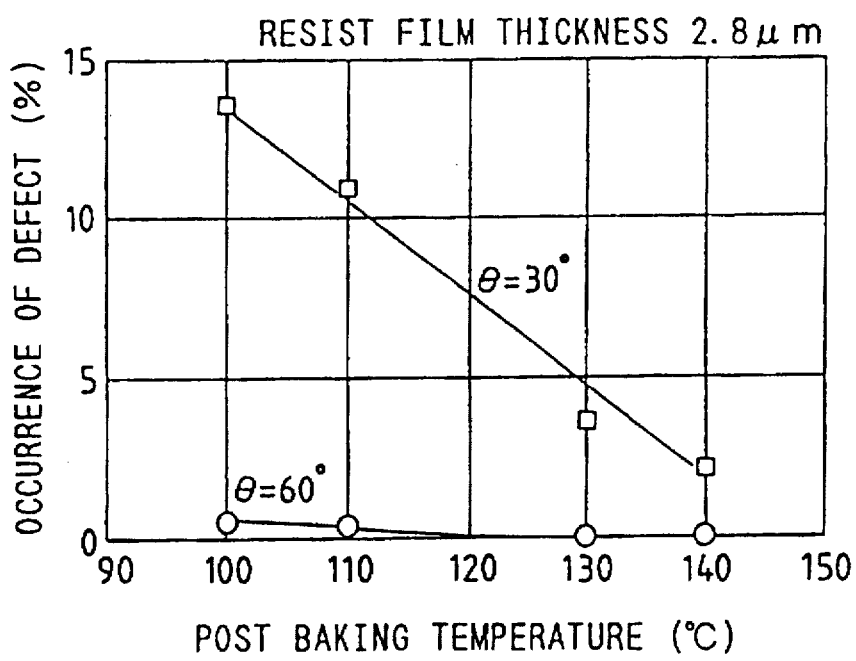
FIG. 24 is a view illustrating the effect of the film thickness of the resist.

The ninth example of the present invention will be explained referring to FIG. 21.

Al 12' was deposited to a film thickness of 0.2 µm on an insulative substrate 10 by means of a vacuum vapor deposition method, which was patterned by a usual photoetching method. Subsequently, a positive type photoresist PR (trade Name: OFPR-800 manufactured by Tokyo Ohka Kogyo Co.) to a film thickness of 2 µm and UV-rays were selectively irradiated and exposed by using a desired photomask. FIG. 21 shows a state obtained by developing them. PAD is an anodic oxidation pad for applying a voltage upon anodic oxidation of Al (terminal for anodic oxidation). A particularly important point is an intersection for each of the Al pattern or mask pattern for anodic oxidation with their pattern edges. That is, as shown in FIG. 21, external angles $θ_1$, $θ_2$ are made to 135°. After post baking them by a heat treatment at 120° C. for 20 min, anodic oxidation was applied such that the liquid level of an anodic oxidation solution situates about the line A–A' in the figure. For the voltage application method in the anodic oxidation, a voltage was gradually increased in an initial stage at a current density of 50 µA/cm² and, when a 100 V was reached, a constant voltage at 100 V was applied for 15 min to conduct anodic oxidation. As a result, $Al_2O_3$ could be grown to a film thickness of about 140 nm on Al 12' in the solution not carrying the photoresist. In this case, the mask for anodic oxidation (photoresist PR) on Al(2) showed sufficient withstand voltage and did not suffer from dielectric breakdown. In particular, while the pattern edge of the mask for anodic oxidation is liable to cause dielectric breakdown, since the external angles $θ_1$, $θ_2$ were made greater than 90° (135°) in this example, occurrence of defect due to dielectric breakdown at the pattern edge of the mask for the anodic oxidation was not caused at all.

EXAMPLE 10

The tenth example of the present invention will be explained referring to FIGS. 25, 26, 27 and 28. An example of applying the present technique to a liquid crystal display using TFT is shown here.

Figure 25:
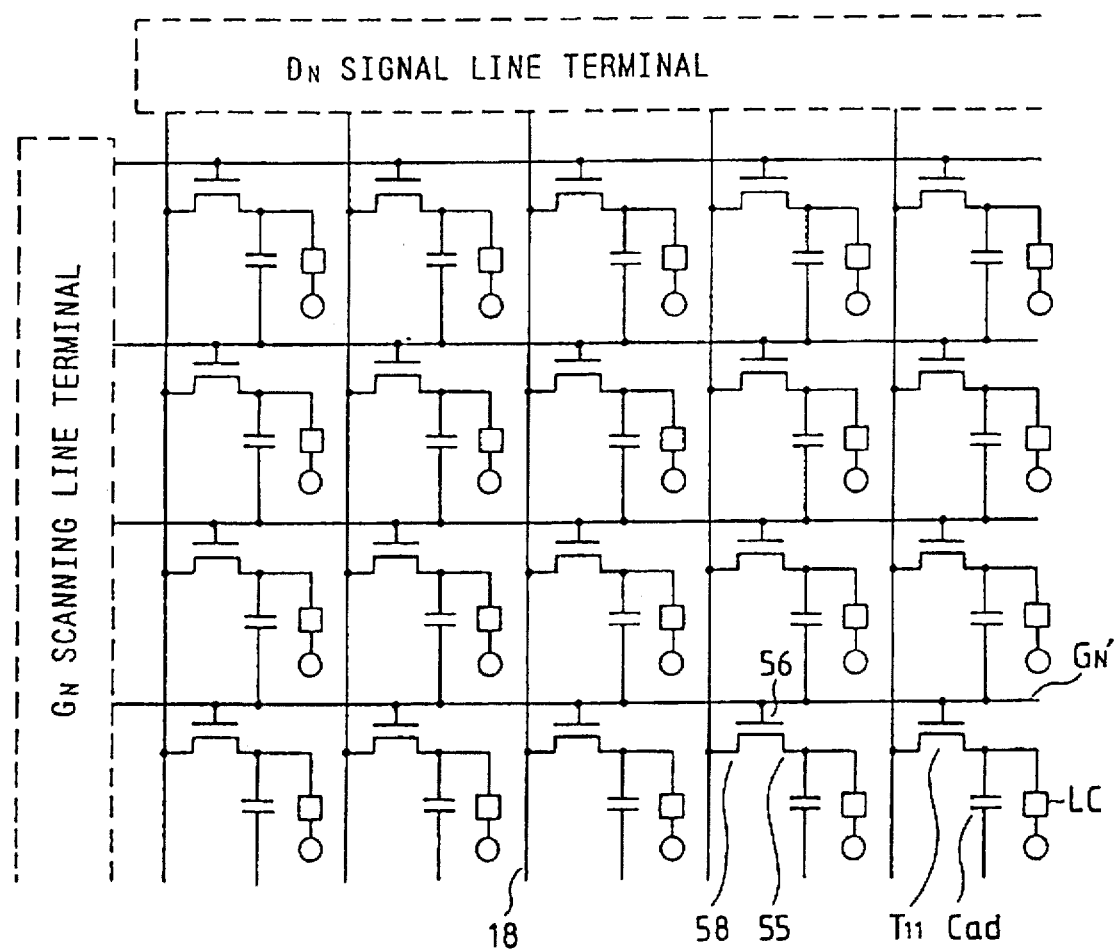
FIGS. 25–26 are an entire plan view schematically illustrating a TFT substrate.

FIG. 25 is a view schematically illustrating a portion of a panel for driving a liquid crystal display by using thin film transistors.

In the figure, $T_{11}$ is a TFT provided on every picture element and a video signal is supplied from a drain terminal $D_N$, and written into each of the picture elements by the transistor. The video signal is supplied by way of TFT $T_{11}$ to liquid crystal LC to develop a desired video image on every picture elements. Cad is an additional capacitance for keeping the video signal longer and 58, 55 and 56 are, respectively, a drain electrode, a source electrode and a gate electrode for each of the transistors. 18 is a signal bus-line for supplying a video signal supplied from the drain terminal of the $D_N$ to each of the picture elements and $G_N'$ is a gate bus-line (scanning line) for selecting the row to be written. The gate bus-line is connected to the gate terminal $G_N$.

For attaining such a liquid crystal display panel, a gate electrode, a gate bus-line and a gate terminal are generally formed at first to a glass substrate.

In this case, explanations will be made to an example of forming the gate electrode, the gate wiring or bus-line and the gate terminal with Al.

Figure 26:
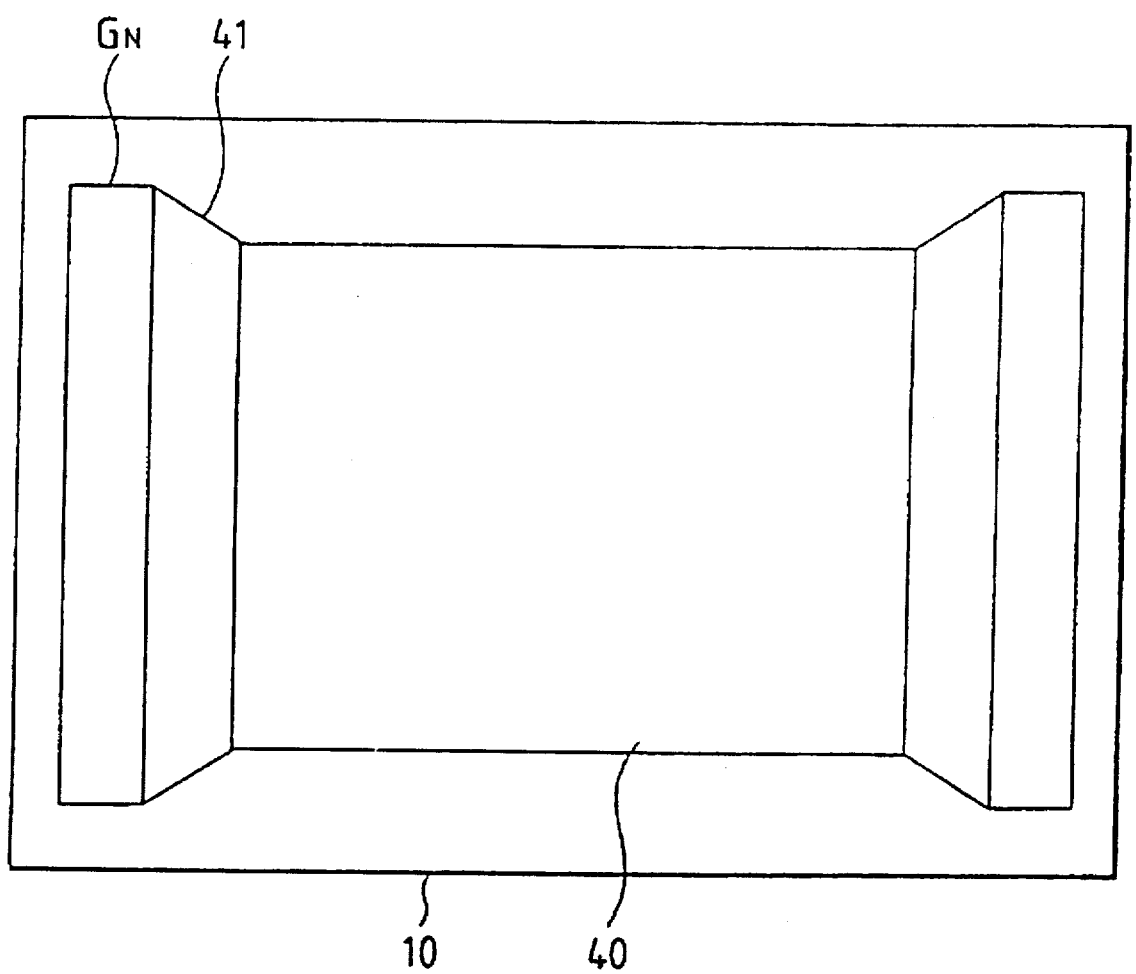

FIG. 26 is a plan view showing the outline in a case where the gate bus-line is applied in a display panel. 10 is a glass substrate and 40 is a device portion containing the gate electrode, the gate bus-line and, further, a transistor or picture element, which is the TFT array portion in FIG. 25 mentioned before. $G_N$ is a gate terminal. 41 is a lead wire portion for connecting the device portion 40 with the gate terminal $G_N$, as well as adjusting the row pitch of the device portion and the pitch of the terminal portion and forming a terminal block by collecting a desired number of lines for the external connection on every one block.

Figures 27A, 27B, 27C:
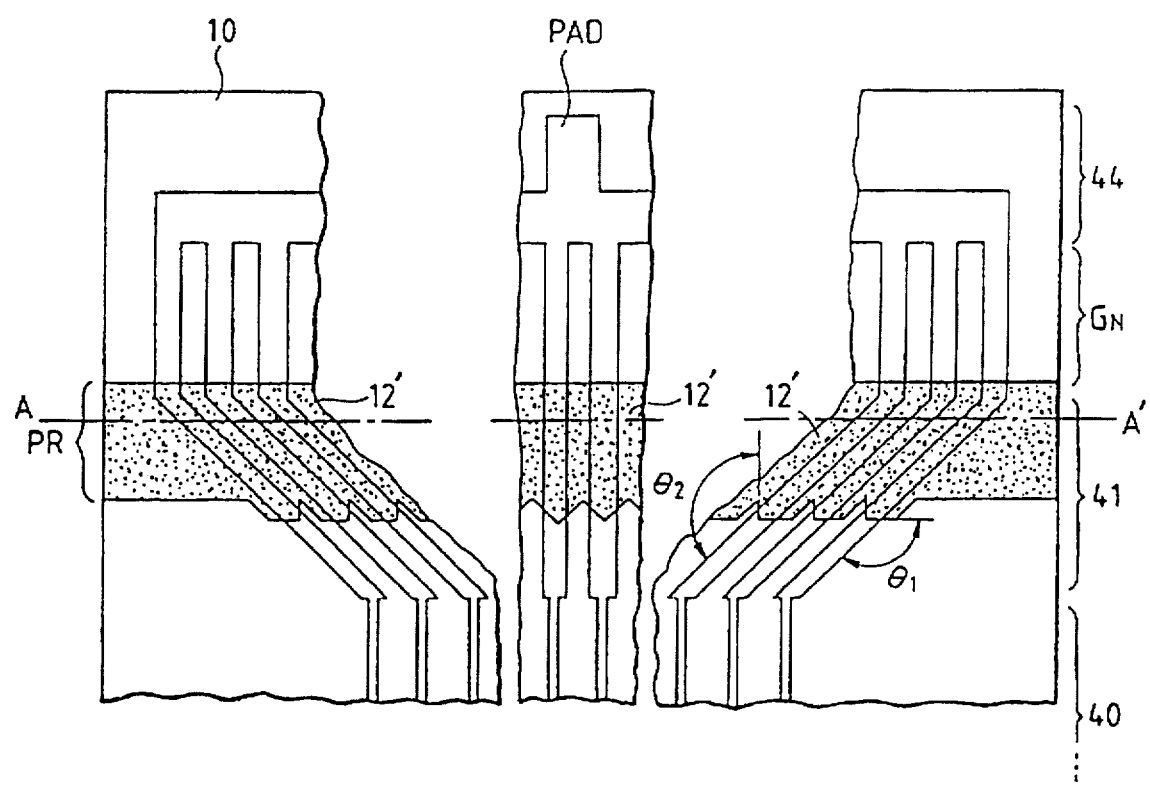
FIG. 27 and FIGS. 29 and 30 are plan views illustrating the state of intersection between the Al pattern and the photoresist end.

FIG. 27 shows an enlarged view near the lead wire portion 41. This figure shows the state in which the device portion 40 in FIG. 26 is rotated by 90° so as to situate it below. The lead wire portion do not form an equivalent interval or parallel pattern as in the gate bus-line and the gate terminal by the reason as described above and, usually, formed obliquely as shown in FIG. 27, and the pattern often takes various directions depending on the places.

Figure 28A:
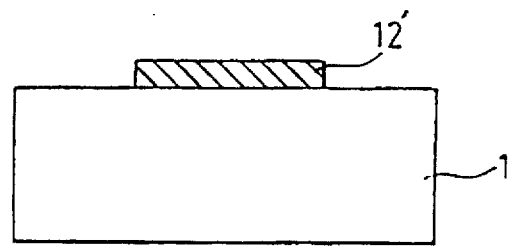
FIGS. 28(A)–28(E) are a partial cross sectional view of a TFT substrate in a still further embodiment according to the present invention.

By the way, FIG. 28(a), (b), (c) and (d) show cross sectional views for the steps in this example for the TFT portion which particularly takes an important and complicate structure in the device portion. In FIG. 28(a), the gate electrode for TFT is formed with Al 12' with 0.3 µm film thickness.

In this case, the device portion 40 in FIG. 26 is anodically oxidized to grow $Al_2O_3$ 13 on Al 12' as shown in FIG. 28, and the $Al_2O_3$ is used for a portion of a gate insulator and an insulation film at the bus-line intersecting portion. Accordingly, oxidation is applied to the portion other than the terminal. The portion gathering the terminals for anodic oxidation is shown as the anodic oxidation pad portion 44 in FIG. 27. Further, there is an anodic oxidation PAD for applying a voltage upon anodic oxidation. PR in FIG. 27 is a positive type photoresist of a mask for anodic oxidation. In this case, the film thickness of the photoresist is set to 3.5 µm. The most important feature is the intersection for each of the Al pattern and the mask pattern for anodic oxidation with their pattern edges in the portion dipped into the anodic oxidation solution. As has been described previously since the Al patterns are directed to various directions in the leading wire portion 41, the external angle between both of the patterns for the photoresist and Al, when the photoresist pattern is formed linearly in the horizontal direction in FIG. 27, the external angle takes various angles, for example, from 40° to 140° is the solution for anodic oxidation. When the external angle takes various angles, in particular, if it takes less than 90° in the case where the photoresist for masking is a positive type, defect is liable to be caused. In this example, all of the external angles are set to 135° as shown in FIG. 27.

Figure 28B:
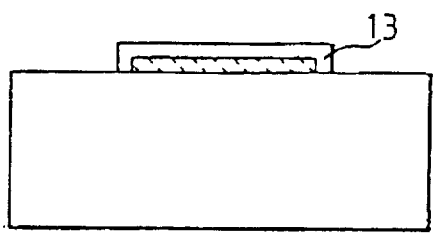

Then, after applying a post baking treatment at 140° C. for 30 min, anodic oxidation was applied. The anodic oxidation was applied such that the liquid level of the solution used for anodic oxidation situates near the line A–A' in FIG. 27. The anodic oxidation solution prepared by adding an aqueous ammonia to an aqueous solution of 3% tartaric acid, neutralizing and then adding propylene glycol by 10 times by volume ratio was used. A constant current was supplied from the anodic oxidation PAD at 30 mA/cm$^2$ in the initial stage and, after 150 V was reached, a voltage was applied for 20 min at a constant voltage to conduct anodic oxidation. As a result, an Al$_2$O$_3$ film could be grown to 210 nm on Al. In this anodic oxidation, since the external angle θ was set to 135° and the post baking was applied at 140° C. for 30 min, there was no defect at all during oxidation. The structure of the transistor portion in this case is as shown in FIG. 28(b).

Figure 28C:
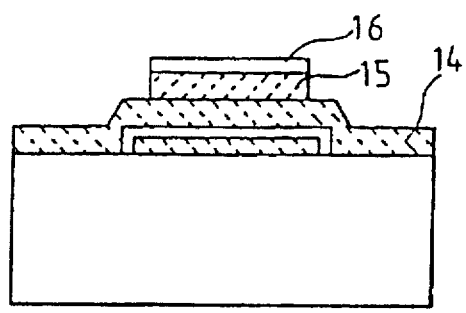
Figure 28D:
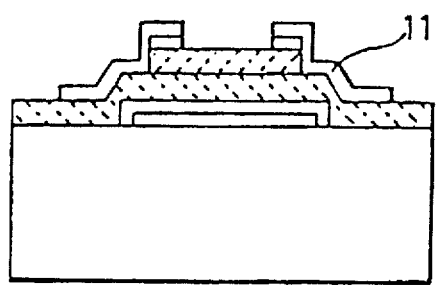

The principle portion of the present technique is as has been described above and explanation will now be made simply for manufacturing a panel for use in a liquid crystal display while referring to FIG. 28. After FIG. 28(b), SiN 14, a-Si(i) 15, a-Si(n) 16 were deposited successively by a plasma CVD method and, subsequently, a-Si(n) 16 and a-Si(i) 15 were fabricated to smaller than the gate electrode width as shown in FIG. 28(c). Then, Cr 11 as the electrode was deposited by means of a vacuum vapor deposition method as shown in FIG. 28(d), to form into a shape of the source and the drain electrode.

Figure 28E:
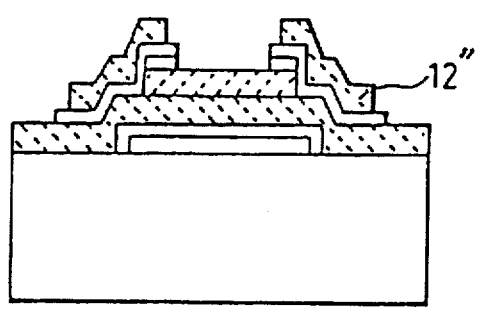

Further, for forming electrode and wiring, Al 12" was deposited by means of a vacuum vapor deposition method as shown in FIG. 28(e). A transparent electrode (for example, ITO film) as a pixel electrode is formed, which may be conducted subsequent to this step or before the formation of the source and the drain electrode (the transparent electrode is not illustrated here for avoiding the complexity). In this way, TFT for liquid crystal display panel was formed. Since the gate insulator of the transistor is constituted with Al$_2$O$_3$ and SiN by anodic oxidation described above, to form a dual layered gate insulator, a structure particularly excellent in the insulation property could be formed.

EXAMPLE 11

Figures 29A, 29B, 29C:
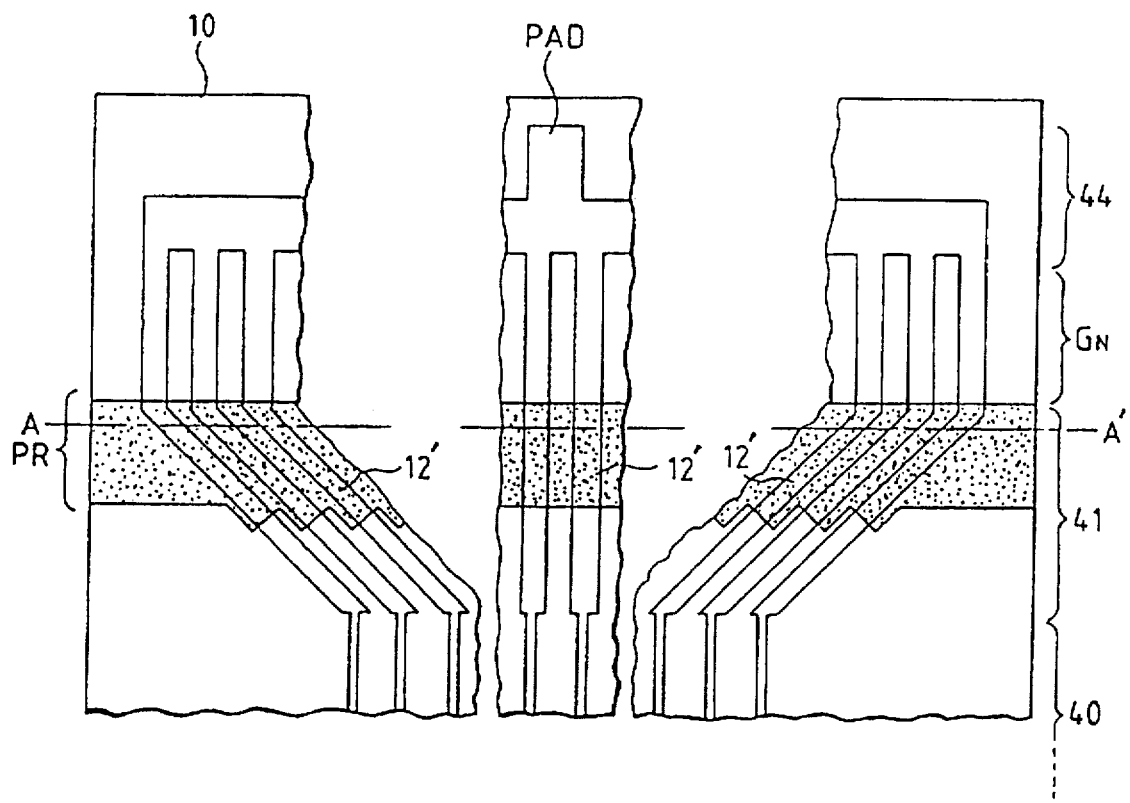

The eleventh example of the present invention will be explained referring to FIG. 29. Further, anodic oxidation was conducted assuming the liquid crystal display panel also in this example. Al 12' was deposited to 0.3 μm on a substrate 10 and Al 12' was fabricated in the same way as in Example 10. Further, a protection mask is disposed between a portion to be anodically oxidized and a portion not to be anodically oxidized for the selective anodic oxidation also in this example 10. In this case, for the mask, the film thickness of OFPR-800 (positive type resist) was set to 4 μm and the external angle between Al 12' and the resist pattern pR was made to 90° in the intersecting point for any of the portions. Subsequently, a post baking was applied at 130° C. for 30 min. Then, electric current was supplied at a current density of 80 mA/cm$^2$ from an anodic oxidation PAD such that the liquid level of the solution for anodic oxidation was near the line A–A' of the figure. Al$_2$O$_3$ was grown while gradually increasing the voltage. After the voltage reached 140 V, the voltage was maintained for 20 min. After conducting the anodic oxidation in this way, the photoresist was removed. As a result, Al$_2$O$_3$ of about 200 nm film thickness could be formed. In this anodic oxidation, defects such as dissolution of Al by anodic oxidation did not occur at all due to the effect of making the mask pattern shape of the photoresist as an angle of 90° at the intersections with any of the Al patterns and sufficiently increasing the film thickness of the photoresist as 4 μm.

EXAMPLE 12

Figures 30A, 30B, 30C:
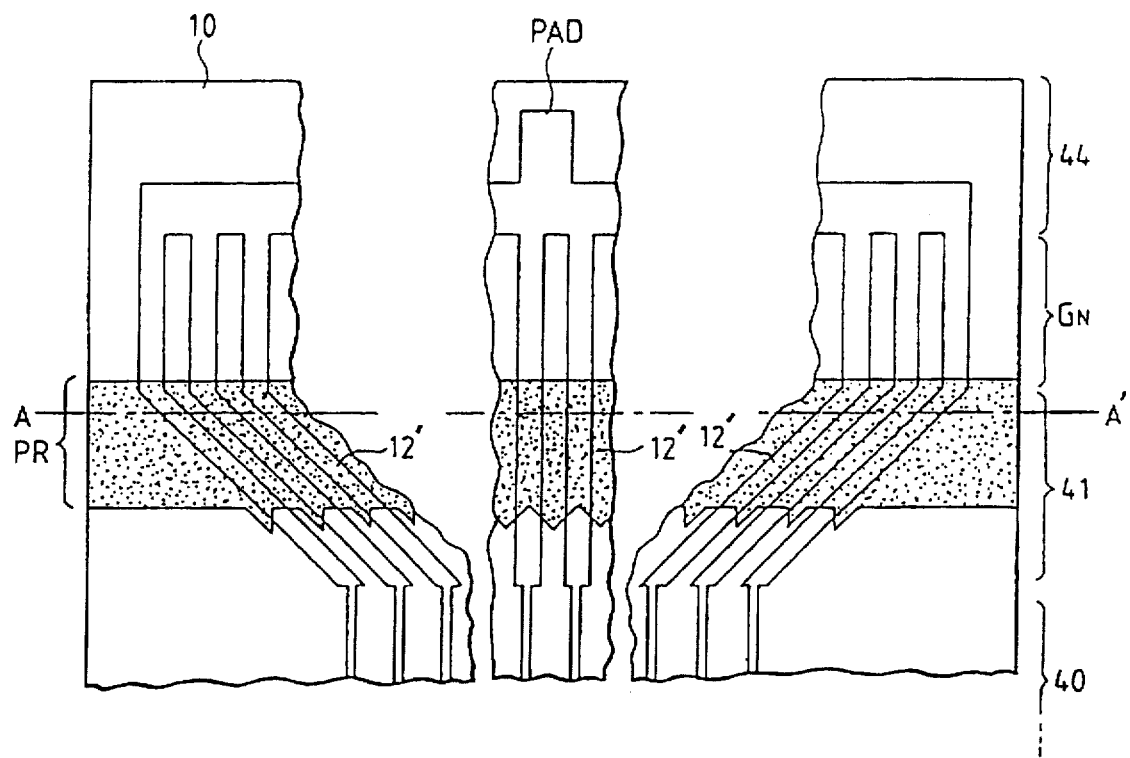

The twelfth example will be explained referring to FIG. 30. Also in this example, anodic oxidation was conducted assuming a liquid crystal display panel.

Al 12' was deposited to 0.35 μm on a substrate 10 and Al 12' was fabricated in the same way as in Example 10. Further, a photoresist PR as the protection mask was disposed between a portion to be anodically oxidized and a portion not to be anodically oxidized for the selective anodic oxidation like that in Example 10. In this case, for the mask, the film thickness of OMR (negative type resist) was made to 3 μm and the external angle between Al and the resist pattern was made to 60° at the intersection in any of the portions. In the negative type resist, resist is polymerized by the halation at the Al pattern edge upon patterning by the UV-ray exposure to form resist residue. In order to eliminate such an effect, the external angle was made to 60° in this example. Subsequently, a post baking at 140° C. for 40 min was applied.

Then, an electric current was supplied at a current density of mA/cm$^2$ from an anodic oxidation PAD such that the liquid level of the solution for anodic oxidation was situated near the line A–A' in the figure. Al$_2$O$_3$ was grown by gradually increasing the voltage. After the voltage reached 200 V, the voltage was maintained for 20 min. After applying anodic oxidation in this way, the photoresist was removed. As a result, Al$_2$O$_3$ with a film thickness of about 280 nm could be formed. In this anodic oxidation, the effect of halation at the Al pattern edge could be eliminated by forming the mask pattern shape of the photoresist to 60° at the intersection with any of the Al patterns and, accordingly, defect such as dissolution or disconnection of Al during anodic oxidation did not occur at all.

EXAMPLE 13

Figure 33:
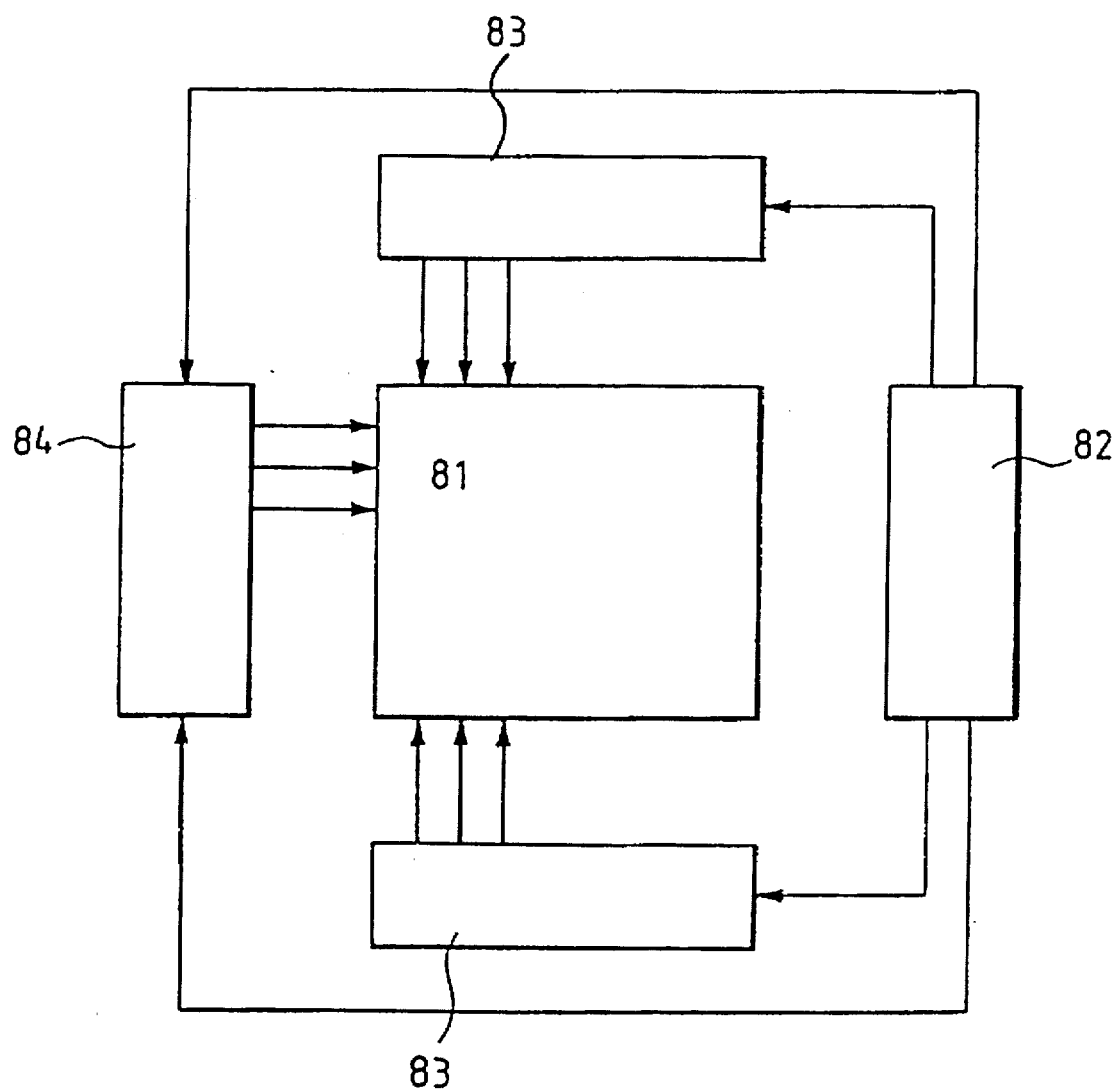

FIG. 33 shows an example of a liquid crystal display equipment according to the present invention. The equipment comprises a liquid crystal display panel 81, a video signal driving circuit 83 for giving a video signal to the liquid crystal display panel, a scanning circuit 84 for giving a scanning signal to the liquid crystal display panel, and a control circuit 82 for giving a TFT information to the video signal driving circuit and the scanning circuit. The control circuit 82 includes, for example, a power source circuit and a circuit for converting information from the upper mathematical processing device into TFT information. When each of the liquid crystal display panels obtained in the foregoing examples was used and incorporated into this equipment, images of high reliability could be obtained in any of the cases.

As shown in each of the foregoing examples, the reliability of the TFT substrate was improved remarkably, the mutual conductance gm was improved by 25 to 50% and the light utilizability was also improved by more than 20% according to the present invention. In addition, the yield could be removed remarkably upon manufacture. Further, since Al is locally applied with anodic oxidation, the wiring resistance could be lowered. Further, the reliability of the liquid crystal display panel using the TFT substrate was improved remarkably. Furthermore, the reliability of the liquid crystal display equipment using the liquid crystal display panel was also improved remarkably.

We claim:

1. A method of manufacturing a thin film transistor substrate, comprising a first step of forming (1) an electrode of a thin film capacitor and (2) a gate bus-line pattern having a gate electrode of a thin film transistor and a gate bus-line to be connected with said gate electrode and a gate terminal, said electrode and said gate bus-line pattern being formed on an insulating substrate, and being made of aluminum or a metal mainly composed of aluminum; a second step of anodically oxidizing said gate bus-line pattern and said electrode of the thin film capacitor into an anodic oxidized film; and a third step of applying a heat treatment to the anodic oxidized film at a temperature within a range from 200° C. to 400° C. after said second step.

* * * * *